(12) United States Patent
Kwon et al.

(10) Patent No.: US 12,213,373 B2
(45) Date of Patent: Jan. 28, 2025

(54) DISPLAY DEVICE AND METHOD FOR MANUFACTURING DISPLAY DEVICE

(71) Applicant: Samsung Display Co., LTD., Yongin-si (KR)

(72) Inventors: Oh June Kwon, Hwaseong-si (KR); Seung Yong Song, Suwon-Si (KR); Won Woo Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 405 days.

(21) Appl. No.: 17/784,099

(22) PCT Filed: Jun. 26, 2020

(86) PCT No.: PCT/KR2020/008403
§ 371 (c)(1),
(2) Date: Jun. 9, 2022

(87) PCT Pub. No.: WO2021/117996
PCT Pub. Date: Jun. 17, 2021

(65) Prior Publication Data
US 2023/0008283 A1     Jan. 12, 2023

(30) Foreign Application Priority Data
Dec. 10, 2019   (KR) .................. 10-2019-0163824

(51) Int. Cl.
*H10K 77/10*     (2023.01)
*H10K 50/86*     (2023.01)
(Continued)

(52) U.S. Cl.
CPC .......... *H10K 77/111* (2023.02); *H10K 50/86* (2023.02); *H10K 71/00* (2023.02); *H10K 2102/311* (2023.02)

(58) Field of Classification Search
CPC ...... H10K 77/111; H10K 50/86; H10K 71/00; H10K 2102/311; H10K 59/873;
(Continued)

(56) References Cited

U.S. PATENT DOCUMENTS

2014/0183473 A1    7/2014  Lee et al.
2014/0240985 A1    8/2014  Kim et al.
(Continued)

FOREIGN PATENT DOCUMENTS

| CN | 106940966 A | 7/2017 |
|----|-------------|--------|
| CN | 109240013 A | 1/2019 |

(Continued)

OTHER PUBLICATIONS

International Search Report—PCT/KR2020/008403 dated Jun. 17, 2021, citing references listed within.

*Primary Examiner* — J. E. Schoenholtz
(74) *Attorney, Agent, or Firm* — CANTOR COLBURN LLP

(57) ABSTRACT

A display device includes: a flexible substrate having a first surface and a second surface opposite to the first surface, where the flexible substrate includes an upper surface portion extending along a first direction, a first bent portion connected to the upper surface portion, a first side portion connected to the first bent portion, a second bent portion connected to the first side portion, a second side portion connected to the second bent portion, a third bent portion connected to the second side portion, and a lower surface portion connected to the third bent portion; and a support member disposed on the second surface of the flexible substrate, where a portion of the support member disposed to overlap the second bent portion has a thickness less than a thickness of a portion disposed on the first side portion and a thickness of a portion disposed on the second side portion.

21 Claims, 27 Drawing Sheets

(51) Int. Cl.
*H10K 71/00* (2023.01)
*H10K 102/00* (2023.01)

(58) Field of Classification Search
CPC ... H10K 2102/351; Y02E 10/549; G09F 9/30;
G09F 9/301; G06F 2203/04102
See application file for complete search history.

(56) References Cited

U.S. PATENT DOCUMENTS

| | | |
|---|---|---|
| 2015/0091012 A1 | 4/2015 | Namkung et al. |
| 2016/0204366 A1 | 7/2016 | Zhang et al. |
| 2016/0293869 A1 | 10/2016 | Saeki et al. |
| 2017/0064845 A1 | 3/2017 | Jung et al. |
| 2017/0199544 A1* | 7/2017 | Choi ..................... G06F 1/1652 |
| 2017/0338294 A1 | 11/2017 | Choi et al. |
| 2018/0069192 A1 | 3/2018 | Ando et al. |
| 2019/0361285 A1* | 11/2019 | Wang ..................... G09F 9/301 |

FOREIGN PATENT DOCUMENTS

| | | |
|---|---|---|
| CN | 109256039 A | 1/2019 |
| CN | 109411511 A | 3/2019 |
| CN | 109461378 A | 3/2019 |
| CN | 109494237 A | 3/2019 |
| KR | 1020140085956 | 7/2014 |
| KR | 1020140122595 | 10/2014 |
| KR | 1020160047322 | 5/2016 |
| KR | 1020160117230 | 10/2016 |

* cited by examiner

DISPLAY DEVICE AND METHOD FOR MANUFACTURING DISPLAY DEVICE

TECHNICAL FIELD

The disclosure relates to a display device and a method for manufacturing a display device.

BACKGROUND ART

As the information society develops, the demand for display devices for displaying images is increasing in various forms. For example, display devices are being applied to various electronic devices such as smartphones, digital cameras, notebook computers, navigation devices, and smart televisions.

The display device may be a flat panel display (LCD) device, such as a liquid crystal display device, a field emission display (FED) device, or an organic light emitting display (OLED) device. OLED display devices may have desirable characteristics such as wide viewing angles, high contrast ratios, and fast response speeds. Since OLED display devices can be implemented as flexible display devices that are bendable or foldable, the application of OLED display devices to electronic devices has increased. For example, recently, display devices that display images on their sides as well as on their front side have been developed by implementing the OLED display devices as flexible display devices.

In the case of a display device that displays an image even on the side thereof, an integrated chip (IC) and a circuit board are mounted on a driving unit of a panel, where the driving unit may be disposed to face a display surface for ease of mounting.

DISCLOSURE

Technical Problem

Embodiments of the disclosure provide a display device in which a floating movement of a driving unit is minimized before a bending process of the driving unit.

Embodiments of the disclosure also provide a method for manufacturing a display device in which a floating movement of a driving unit is minimized before a bending process of a driving unit.

However, embodiments of the disclosure are not restricted to the one set forth herein. The above and other aspects of the disclosure will become more apparent to one of ordinary skill in the art to which the disclosure pertains by referencing the detailed description of the disclosure given below.

Technical Solution

According to an embodiment of the disclosure, a display device includes: a flexible substrate having a first surface and a second surface opposite to the first surface defined, where the flexible substrate includes an upper surface portion extending along a first direction, a first bent portion connected to the upper surface portion, a first side portion connected to the first bent portion, a second bent portion connected to the first side portion, a second side portion connected to the second bent portion, a third bent portion connected to the second side portion, and a lower surface portion connected to the third bent portion; and a support member disposed on the second surface of the flexible substrate, where the first bent portion is bent in a way such that the first side portion is bent from the upper surface portion toward a thickness direction, the second bent portion is bent in a way such that the second surface of the first side portion and the second surface of the second side portion face each other, the third bent portion is bent in a way such that the lower surface portion is bent from the second side portion toward the first direction and the second surface of the lower surface portion and the second surface of the upper surface portion face each other, and a portion of the support member disposed to overlap the second bent portion has a thickness less than a thickness of a portion disposed on the first side portion and a thickness of a portion disposed on the second side portion.

In an embodiment, the support member may include a first portion disposed on the second surface of the upper surface portion, the second surface of the first bent portion, and the second surface of the first side portion, a second portion disposed on the second surface of the second bent portion, a third portion disposed on the second surface of the second side portion, a fourth portion disposed on the second surface of the third bent portion, and a fifth portion disposed on the second surface of the lower surface portion, and the thickness of the second portion may be less than the thicknesses of the first portion and the third portion.

In an embodiment, the support member may have a first surface facing the flexible substrate and a second surface opposite to the first surface defined, the second portion may be bent in a way such that the second surface of the third portion and the second surface of the first portion face each other, and the fourth portion may be bent in a way such that the second surface of the fifth portion and the second surface of the first portion face each other.

In an embodiment, the second surface of the first portion and the second surface of the fifth portion may be in contact with each other, and the second surface of the first portion and the second surface of the third portion may be in contact with each other.

In an embodiment, the second surface of the first portion may not be in contact with the second surface of the fourth portion.

In an embodiment, the thickness of the fourth portion may be less than the thicknesses of the first portion and the third portion.

In an embodiment, the thickness of the fourth portion may be less than the thicknesses of the third portion and the fifth portion.

In an embodiment, the support member may not be disposed on the second bent portion, and the support member may not be disposed on the third bent portion.

In an embodiment, the second portion may include an uneven surface, a surface height of a convex portion of the second portion is equal to a surface height of the first portion, and a surface height of a concave portion of the second portion may be less than the surface height of the first portion.

In an embodiment, the first portion may further include a burr shaped portion disposed adjacent to the second portion, and the burr shaped portion may protrude from the second surface of the first portion.

In an embodiment, the third portion may further include burr shaped portion disposed adjacent to the second portion and the fourth portion.

In an embodiment, the display device may further include a driving chip disposed on the first surface of the lower surface portion, and the driving chip may be disposed to overlap the upper surface portion in the thickness direction.

In an embodiment, the display device may further include a circuit board disposed on the first surface of an end of the lower surface portion.

In an embodiment, the display device may further include an optical member disposed on the first surface of the flexible substrate, and the optical member may be disposed on the upper surface portion, the first bent portion, and the first side portion of the flexible substrate.

In an embodiment, the display device may further include a window member disposed on the optical member.

In an embodiment, the display device may further include a driving chip disposed on the first surface of the second side portion, and the driving chip may be disposed to overlap the first side portion in a side direction.

According to an embodiment of the disclosure, a method for manufacturing a display device includes: preparing a flexible substrate having a first surface and a second surface opposite to the first surface, and a support member disposed over the second surface of the flexible substrate, where the flexible substrate includes an upper surface portion extending along a first direction, a first bent portion connected to the upper surface portion, a first side portion connected to the first bent portion, a second bent portion connected to the first side portion, a second side portion connected to the second bent portion, a third bent portion connected to the second side portion, and a lower surface portion connected to the third bent portion, and the support member includes a first portion disposed on the second surface of the upper surface portion, the second surface of the first bent portion, and the second surface of the first side portion, a second portion disposed on the second surface of the second bent portion, a third portion disposed on the second surface of the second side portion, a fourth portion disposed on the second surface of the third bent portion, and a fifth portion disposed on the second surface of the lower surface portion; bending the first bent portion by disposing a curved window on the first surface of the flexible substrate in a way such that the first side portion of the flexible substrate is bent from the upper surface portion toward a thickness direction; and making a thickness of the second portion smaller than a thickness of adjacent portions thereof.

In an embodiment, the method may further include making a thickness of the fourth portion smaller than a thickness of adjacent portions thereof before or after the making the thickness of the second portion smaller than the thickness of the adjacent portions thereof.

In an embodiment, the making the thickness of the fourth portion smaller than the thickness of the adjacent portions thereof before or after the making the thickness of the second portion smaller than the thickness of the adjacent portions thereof may include bringing a tip of a heat block into contact with each of the second portion and the fourth portion.

In an embodiment, the driving chip may be disposed on the second side portion of the flexible substrate.

In an embodiment, the bending the first bent portion may include bending the first bent portion along a curved surface of the curved window by disposing the curved window on the first surface of the flexible substrate.

Other detailed features of the embodiments are described in the detailed description and shown in the drawings.

Advantageous Effects

According to embodiments of the disclosure, in a display device and a method for manufacturing a display device, primary bending of a display panel and a support member is performed while the support member is disposed over the entire surface of a lower portion of the display panel, and a lower cover member, such as a heat dissipation sheet or the like, is formed on the support member, so that floating of the display panel and the support member can be reduced when the lower cover member is formed.

In such embodiments, recessed regions are formed only in areas of the support member that overlap the portions of the display panel where secondary bending and tertiary bending are performed, so that voids of the display device can be minimized after the tertiary bending is conducted.

However, the features of the embodiments are not restricted to the one set forth herein. The above and other features of the embodiments will become more apparent to one of daily skill in the art to which the embodiments pertain by referencing the claims.

MODE FOR INVENTION

Figure 1:
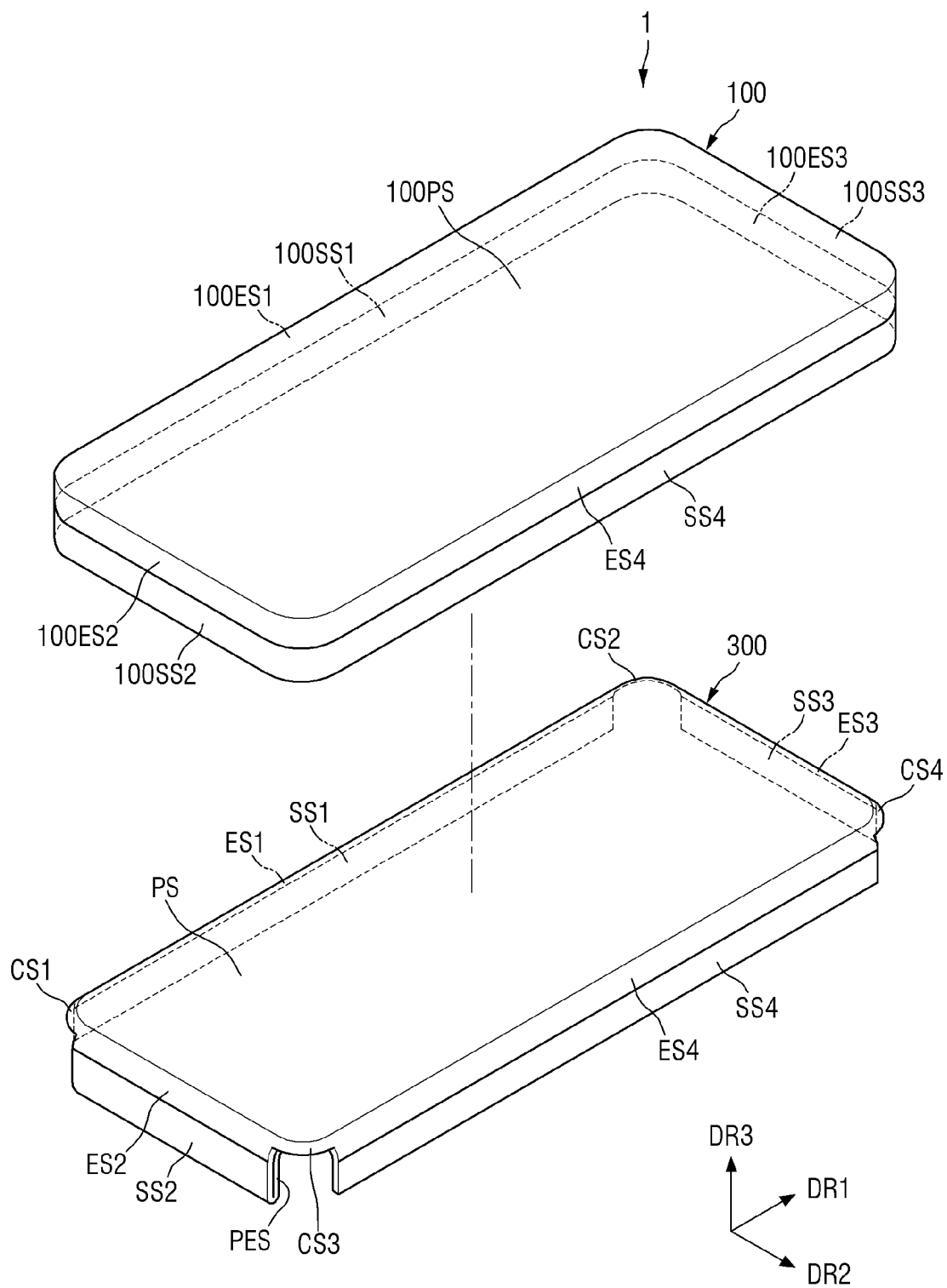
FIG. 1 is an exploded perspective view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

When an element or layer is disposed "on" another element or layer, it may be directly disposed on another element or layer, or another layer or another element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the disclosure.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described with reference to the accompanying drawings.

Figure 2:
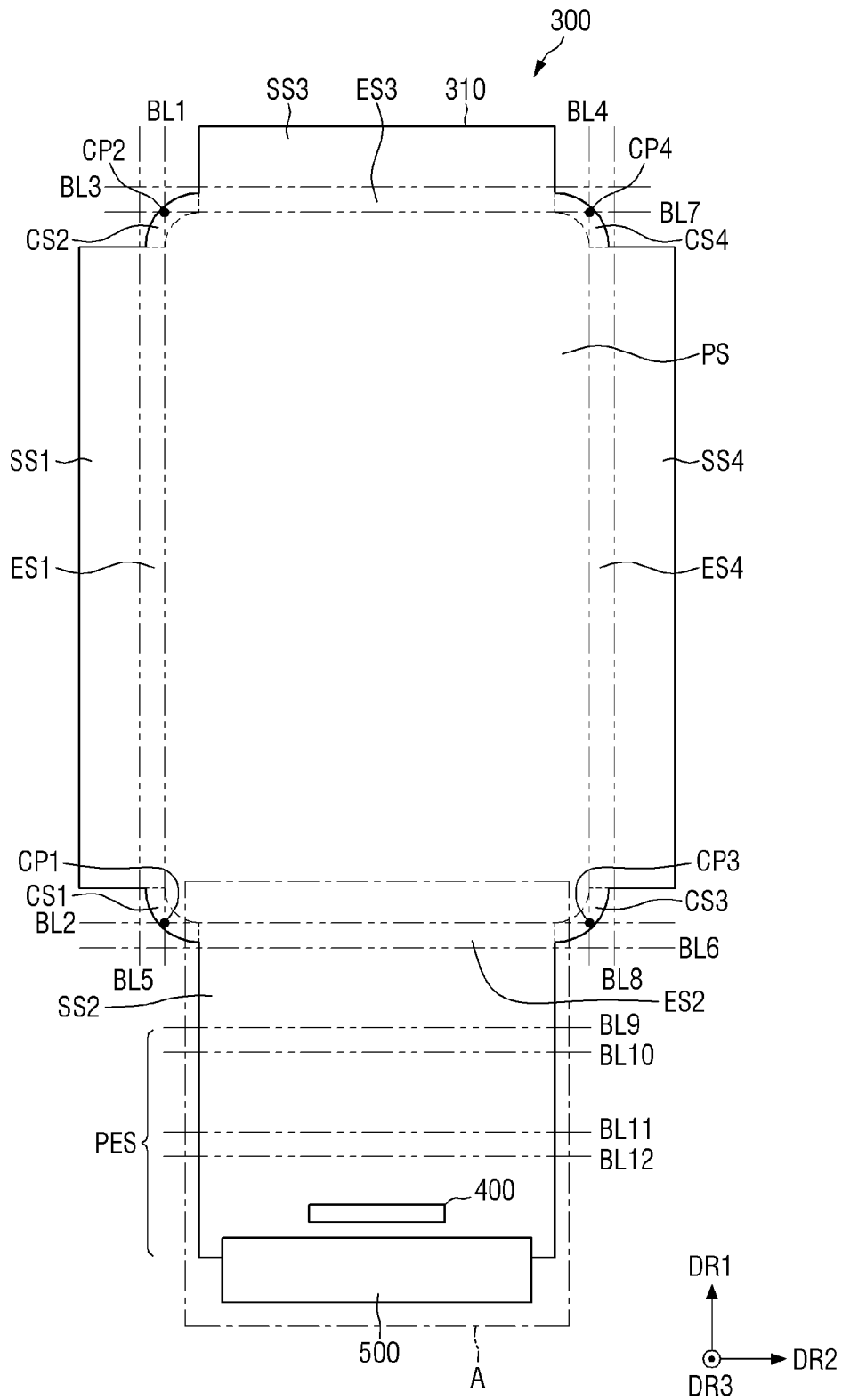
FIG. 2 is a top plan view of a display device according to an embodiment.
Figure 3:
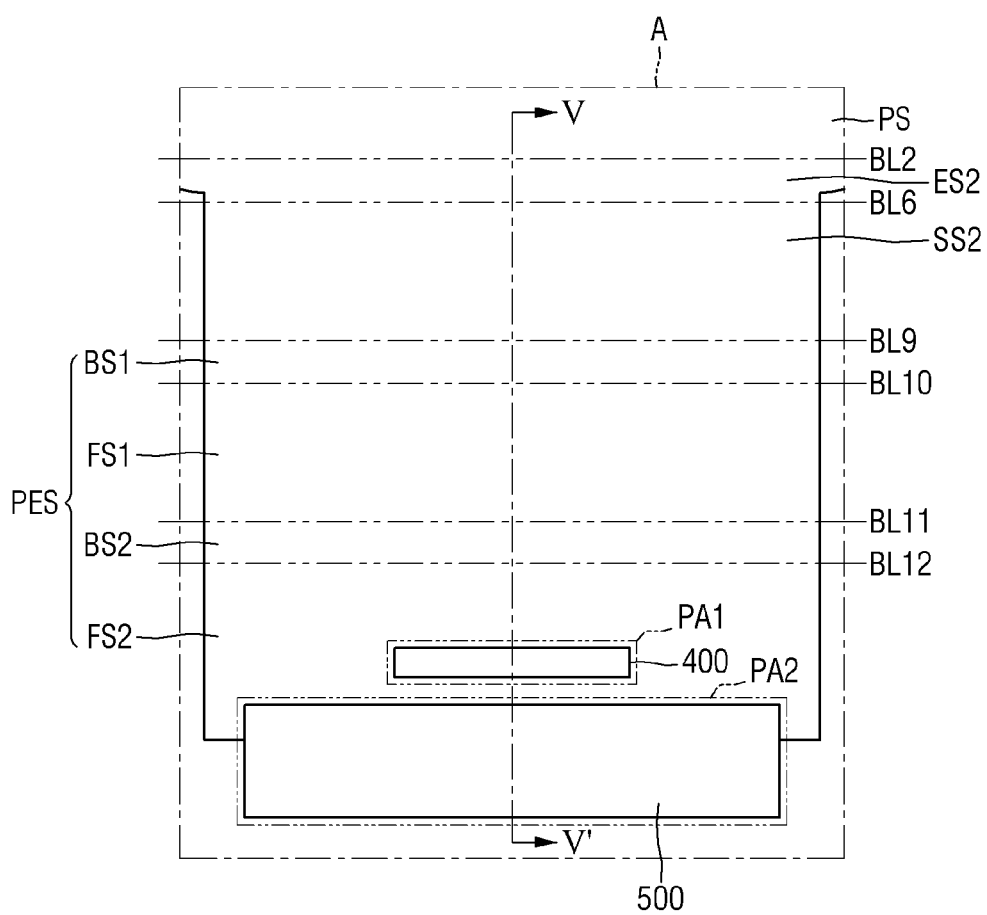
FIG. 3 is an enlarged view of portion A of FIG. 2.
Figure 4:
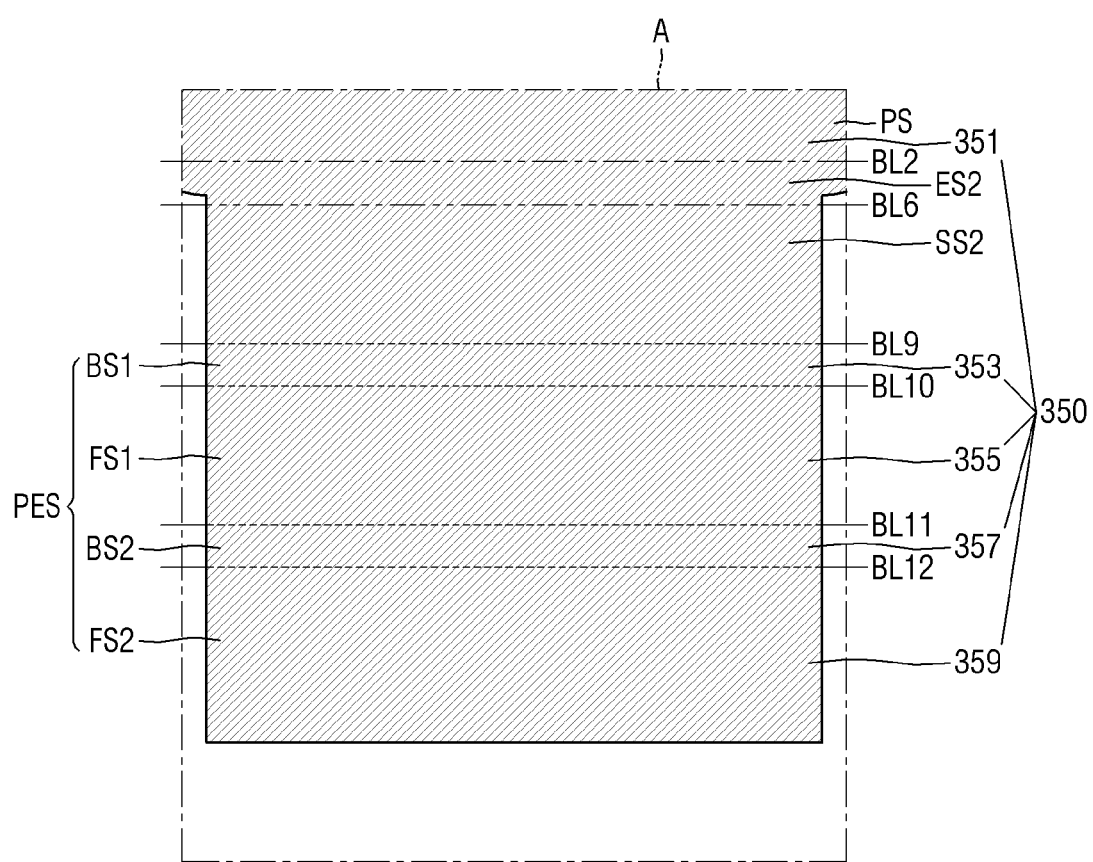
FIG. 4 is a plan layout view illustrating the correspondence between a flexible substrate and a support member.
Figure 5:
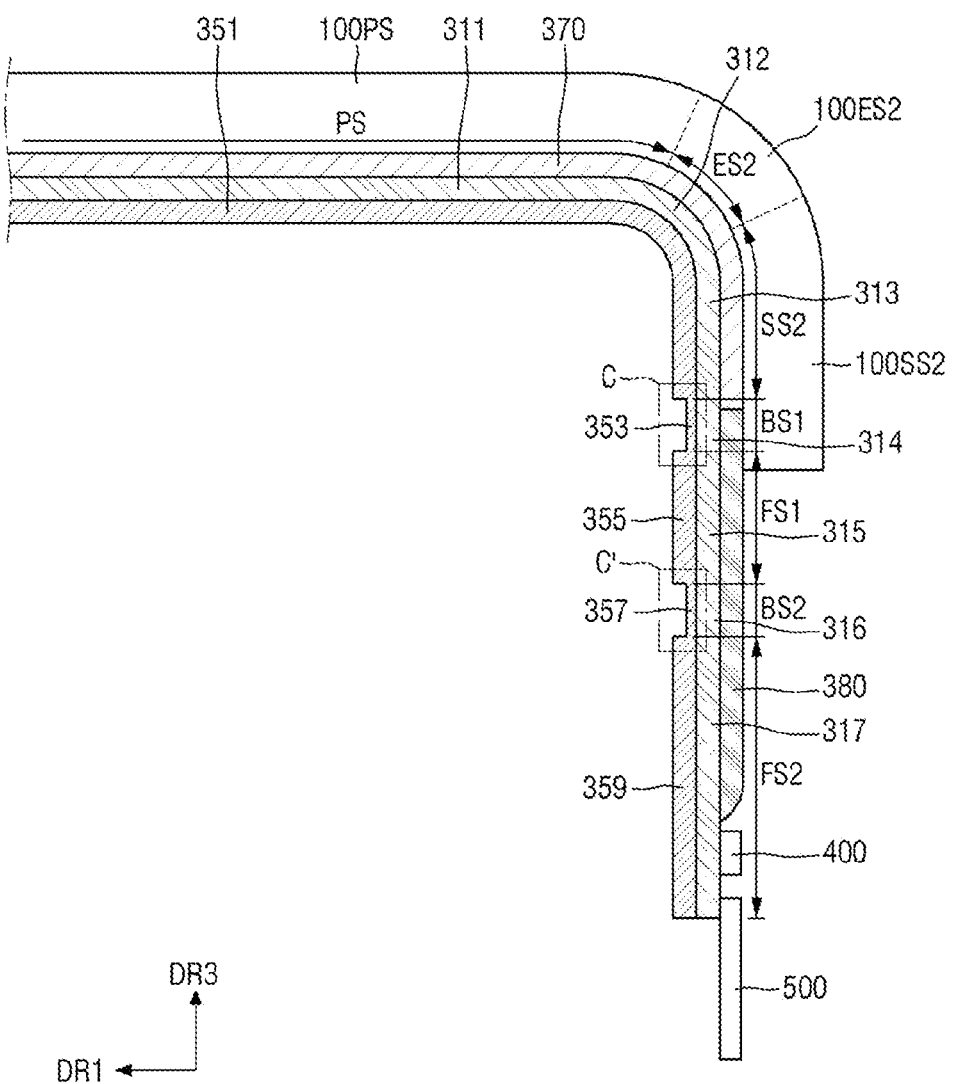
FIG. 5 is a cross-sectional view taken along line X1-X1' of FIG. 3.
Figure 6:
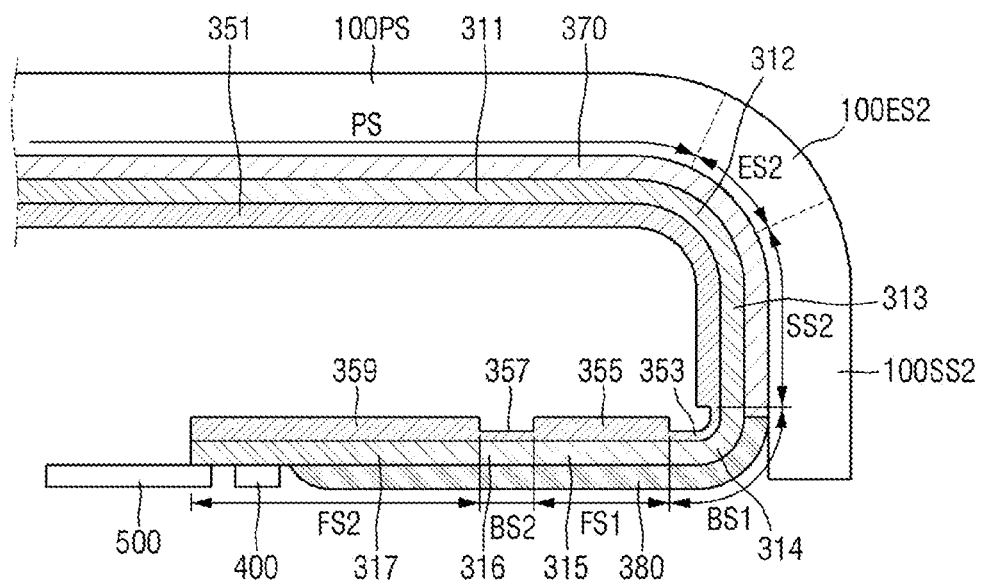
FIG. 6 is a cross-sectional view of a display device after secondary bending according to an embodiment.
Figure 7:
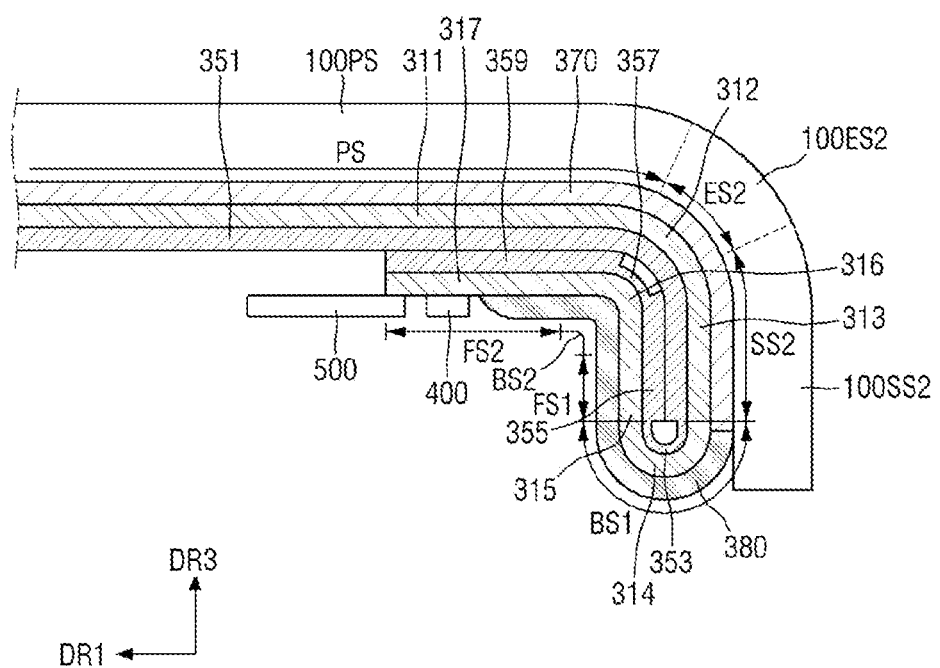
FIG. 7 is a cross-sectional view of a display device after tertiary bending according to an embodiment.
Figure 8:
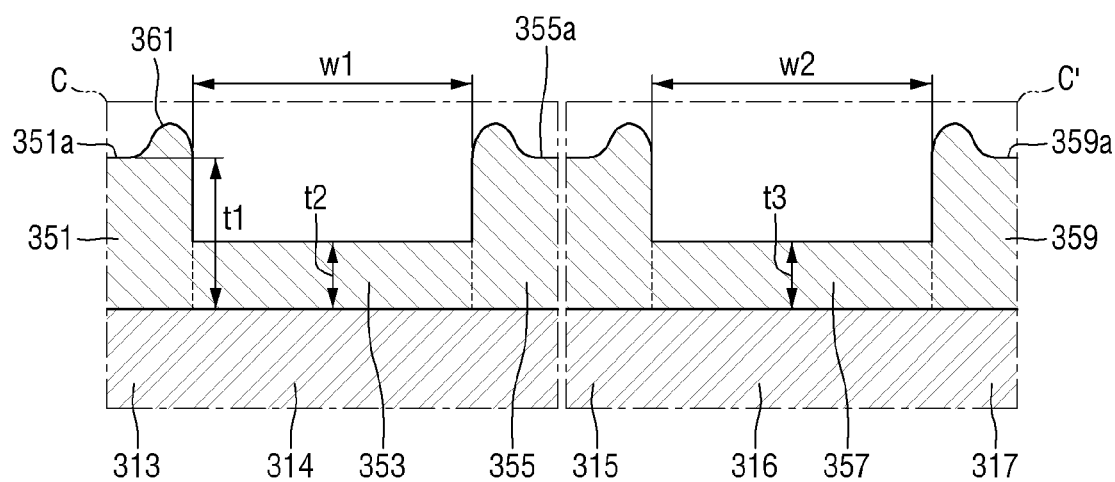
FIG. 8 is an enlarged view illustrating portions C and C' of FIG. 5.

FIG. 1 is an exploded perspective view of a display device according to an embodiment, FIG. 2 is a top plan view of a display device according to an embodiment, FIG. 3 is an enlarged view of portion A of FIG. 2, FIG. 4 is a plan layout view illustrating the correspondence between a flexible substrate and a support member, FIG. 5 is a cross-sectional view taken along line X1-X1' of FIG. 3, FIG. 6 is a cross-sectional view of a display device after secondary bending according to an embodiment, FIG. 7 is a cross-sectional view of a display device after tertiary bending according to an embodiment, and FIG. 8 is an enlarged view illustrating portions C and C' of FIG. 5. FIG. 5 is a cross-sectional view of a display device after primary bending according to an embodiment.

In embodiments, a first direction DR1 and a second direction DR2 are different directions intersecting each other. In the plan view of FIG. 2, for convenience of description, the first direction DR1 that is a vertical direction and the second direction DR2 that is a horizontal direction are defined. Further, a third direction DR3 that is a thickness direction is defined. In the following embodiments, one side in the first direction DR1 represents an upward direction in a plan view, and the other side in the first direction DR1 represents a downward direction in a plan view. One side in the second direction DR2 represents a direction toward the right side in a plan view, and the other side in the second direction DR2 represents a direction toward the left side in a plan view. One side in the third direction DR3 represents a display surface (an upper surface in the case of a top-emission display device) and the other side in the third direction DR3 represents a surface opposite to the display surface. It should be understood, however, that a direction mentioned in the embodiment refers to a relative direction and the embodiments are not limited to the direction mentioned.

Referring to FIGS. 1 to 8, an embodiment of a display device 1 may include a cover window member 100 and a display panel 300 disposed on a lower portion of the cover window member 100. In such an embodiment, the display device 1 may further include a data driving integrated circuit 400 mounted on the display panel 300 and a printed circuit board 500.

The display panel 300 may include a flexible substrate 310 and an optical member 370 disposed on the flexible substrate 310.

The display panel 300 may include a planar portion PS, a first side portion SS1, a second side portion SS2, a third side portion SS3, a fourth side portion SS4, a first edge portion ES1, a second edge portion ES2, a third edge portion ES3, a fourth edge portion ES4, a first corner portion CS1, a second corner portion CS2, a third corner portion CS3, a fourth corner portion CS4, and a multi-bent portion PES extending from the second side portion SS2.

The display panel 300 may include the flexible substrate 310.

The flexible substrate 310 is a flexible substrate that can be bent, folded, rolled, and the like, and may include or be made of plastic. In an embodiment, for example, the flexible substrate 310 may include polyethersulphone, polyacrylate (PA), polyarylate (PAR), polyetherimide (PEI), polyethylene naphthalate. (PEN), polyethylene terepthalate (PET), polyphenylene sulfide (PPS), polyacrylate, polyimide (PI), polycarbonate (PC), cellulose triacetate (CAT), cellulose acetate propionate (CAP) or combinations thereof. Alternatively, the flexible substrate 310 may include a metal material having high ductility.

The planar portion PS or an upper surface portion may be a portion that is formed flat without being bent. The planar portion PS may have a quadrilateral planar shape having a pair of short sides in the second direction DR2 and a pair of long sides in the first direction DR1. In the planar portion PS, corners where the short sides and the long sides meet may be curved to have a predetermined curvature. The planar portion PS may include a top surface or a display surface (in the case of a top-emission display device) of the display panel 300.

The first edge portion ES1 may extend from the other side of the flat part PS in the second direction DR2. The first edge portion ES1 may be disposed between the planar portion PS and the first side portion SS1. The first edge portion ES1 may be a portion that is curved between a first bending line BL1 and a fifth bending line BL5 with a predetermined curvature. The first bending line BL1 may be the boundary between the planar portion PS and the first edge portion ES1 and the fifth bending line BL5 may be the boundary between the first side portion SS1 and the first edge portion ES1.

The first side portion SS1 may extend from the other side of the first edge portion ES1 in the second direction DR2. The first side portion SS1 may include the left side surface of the display panel 300. The first side portion SS1 may have a quadrilateral planar shape having a pair of short sides extending in the third direction DR3 and a pair of long sides extending in the first direction DR1.

The second edge portion ES2 may extend from the other side of the planar portion PS in the first direction DR1. The second edge portion ES2 may extend from the lower side of the planar portion PS. The second edge portion ES2 may be disposed between the planar portion PS and the second side portion SS2. The second edge portion ES2 may be a portion that is curved between a secondary bending line BL2 and a sixth bending line BL6 with a predetermined curvature. The second bending line BL2 may be the boundary between the planar portion PS and the second edge portion ES2, and the sixth bending line BL6 may be the boundary between the second side portion SS2 and the second edge portion ES2.

The second side portion SS2 may extend from the other side of the second edge portion ES2 in the first direction DR1. The second side portion SS2 may include a lower surface of the display panel 300. The second side portion SS2 may have a quadrilateral planar shape including a pair of short sides in the third direction DR3 and a pair of long sides in the second direction DR2.

The third edge portion ES3 may extend form one side of the planar portion PS in the first direction DR1. The third edge portion ES3 may extend from the upper side of the planar portion PS. The third edge portion ES3 may be disposed between the planar portion PS and the third side portion SS3. The third edge portion ES3 may be a portion that is curved between a third bending line BL3 and a seventh bending line BL7 with a predetermined curvature. The third bending line BL3 may be the boundary between the planar portion PS and the third edge portion ES3 and the seventh bending line BL7 may be the boundary between the third side portion SS3 and the third edge portion ES3.

The third side portion SS3 may extend from one side of the third edge portion ES3 in the first direction DR1. The third side portion SS3 may include an upper surface of the display panel 300. The third side portion SS3 may have a quadrilateral planar shape including a pair of short sides in the third direction DR3 and a pair of long sides in the second direction DR2.

The fourth edge portion ES4 may extend form one side of the planar portion PS in the second direction DR2. The fourth edge portion ES4 may extend from the right side of the planar portion PS. The fourth edge portion ES4 may be disposed between the planar portion PS and the fourth side portion SS4. The fourth edge portion ES4 may be a portion that is curved between a fourth bending line BL4 and an eighth bending line BL8 with a predetermined curvature. The fourth bending line BL4 may be the boundary between the planar portion PS and the fourth edge portion ES4 and the eighth bending line BL8 may be the boundary between the fourth side portion SS4 and the fourth edge portion ES4.

The fourth side portion SS4 may extend from the other side of the fourth edge portion ES4 in the second direction DR2. The fourth side portion SS4 may include the right side surface of the display panel 300. The fourth side portion SS4 may have a quadrilateral planar shape having a pair of short sides extending in the third direction DR3 and a pair of long sides extending in the first direction DR1.

A first corner portion CS1 may be disposed between the first edge portion ES1 and the second edge portion ES2. Since the first corner portion CS1 is not disposed between the first side portion SS1 and the second side portion SS2, an empty space may be provided between the first side portion SS1 and the second side portion SS2. The width of the first corner portion CS1 may be less than the widths of the first edge portion ES1 and the second edge portion ES2. A first dead space may be provided on the outside of the first corner portion CS1. The first dead space may be defined as an empty space in a first corner area between the first edge portion ES1 and the second edge portion ES2, where the first corner portion CS1 may not be disposed.

The second corner portion CS2 may be disposed between the first edge portion ES1 and the third edge portion ES3. Since the second corner portion CS2 is not disposed between the first side portion SS1 and the third side portion SS3, an empty space may be provided between the first side portion SS1 and the third side portion SS3. The width of the second corner portion CS2 may be less than the widths of the first edge portion ES1 and the third edge portion ES3. Thus, when viewed from above the flat portion, a second dead space may be provided on the outside of the second corner portion CS2. The second dead space may be defined as an empty space in a second corner area between the first edge portion ES1 and the third edge portion ES3, where the second corner portion CS2 may not be disposed.

The third corner portion CS3 may be disposed between the second edge portion ES2 and the fourth edge portion ES4. Since the third corner portion CS3 is not disposed between the second side portion SS2 and the fourth side portion SS4, an empty space may be provided between the second side portion SS2 and the fourth side portion SS4. The width of the third corner portion CS3 may be less than the widths of the second edge portion ES2 and the fourth edge portion ES4. Thus, when viewed from above the flat portion, a third dead space may be provided on the outside of the third corner portion CS3. The third dead space may be defined as an empty space in a third corner area between the second edge portion ES2 and the fourth edge portion ES4, where the third corner portion CS3 may not be disposed.

The fourth corner portion CS4 may be disposed between the third edge portion ES3 and the fourth edge portion ES4. Since the fourth corner portion CS4 is not disposed between the third side portion SS3 and the fourth side portion SS4, an empty space may be provided between the third side portion SS3 and the fourth side portion SS4. The width of the fourth corner portion CS4 may be less than the widths of the third edge portion ES3 and the fourth edge portion ES4. Thus, when viewed from above the flat portion, a fourth dead space may be provided on the outside of the fourth corner portion CS4. The fourth dead space may be defined as an empty space in a fourth corner area between the third edge portion ES3 and the fourth edge portion ES4, where the fourth corner portion CS4 may not be disposed.

As shown in FIG. 2, in an embodiment, a first intersection point CP1 between the first bending line BL1 and the second bending line BL2 may overlap the first corner portion CS1. In such an embodiment, a strain may be applied to the first corner portion CS1 by the bending force of the first edge portion ES1 and the first side portion SS1 and the bending force of the second edge portion ES2 and the second side portion SS2.

In such an embodiment, the first intersection point CP1 between the first bending line BL1 and the second bending line BL2 may be provided not to overlap the first corner portion CS1 to prevent the strain from being applied to the first corner portion CS1. In such an embodiment, the first intersection point CP1 between the first bending line BL1 and the second bending line BL2 may be disposed on the outside of the first corner portion CS1. Features of the first intersection point CP1 described above equally applies to second to fourth intersection points CP2, CP3 and CP4, and thus any repetitive detailed descriptions of the second to fourth intersection points CP2, CP3 and CP4 will be omitted.

The multi-bent portion PES may extend from the other side of the second side portion SS2 in the first direction DR1. The multi-bent portion PES may extend from the lower side of the second side portion SS2.

The multi-bent portion PES may include a plurality of bent portions BS1 and BS2 that are bent with respect to a plurality of bending lines BL9 to BL12 with a predetermined curvature. The multi-bent portion PES may further include first and second flat portions FS1 and FS2, as well as the plurality of bent portions BS1 and BS2. The data driving integrated circuit 400 and the printed circuit board 500 may be disposed on the multi-bent portion PES. Each of the bent portions BS1 and BS2 of the multi-bent portion PES may be bent in a predetermined direction, and the multi-bent portion PES may be disposed in a way such that an end thereof faces the planar portion PS of the display panel 300.

The first bent portion BS1 may be connected to the second side portion SS2. The first bent portion BS1 may be disposed between the first flat portion FS1 and the second side portion SS2. The first bent portion BS1 may be a portion that is curved between the ninth bending line BL9 and the tenth bending line BL10 with a predetermined curvature. The ninth bending line BL9 may be the boundary between the second side portion SS2 and the first bent portion BS1 and the tenth bending line BL10 may be the boundary between the first bent portion BS1 and the first flat portion FS1. The first bent portion BS1 may be a portion that is curved at the time of secondary bending of the display device 1 as will be described below.

The first flat portion FS1 may be connected to the first bent portion BS1. The first flat portion FS1 may be disposed between the first bent portion BS1 and the second bent portion BS2. The first flat portion FS1 may have a quadrilateral planar shape including a pair of short sides in the first direction DR1 and a pair of long sides in the second direction DR2.

The second bent portion BS2 may be connected to the first flat portion FS1. The second bent portion BS2 may be disposed between the first flat portion FS1 and the second flat portion FS2. The second bent portion BS2 may be a portion that is curved between the eleventh bending line BL11 and the twelfth bending line BL12 with a predetermined curvature. The eleventh bending line BL11 may be the boundary between the first flat portion FS1 and the second bent portion BS2 and the twelfth bending line BL12 may be the boundary between the second bent portion BS2 and the second flat portion FS2. The second bent portion BS2 may be a portion that is bent at the time of tertiary bending of the display device 1 as will be described below.

The second flat portion FS2 may be connected to the second bent portion BS2. The second flat portion FS2 may include an end of the multi-bent portion PES. The second flat portion FS2 may have a quadrilateral planar shape including a pair of short sides in the first direction DR1 and a pair of long sides in the second direction DR2.

The second flat portion FS2 may include a first pad area PA1 and a second pad area PA2. The first pad area PA1 may be disposed between the second bent portion BS2 and the end of the second flat portion FS2, and the second pad area PA2 may be disposed between the first pad area PA1 and the end of the second flat portion FS2. The first pad area PA1 may be provided with a plurality of first pads, and the data driving integrated circuit 400 may be mounted on the first pad. The data driving integrated circuit 400 may be disposed on the first pad area PA1 in the form of a driving integrated chip (IC).

The second pad area PA2 may be provided with a plurality of second pads, and the printed circuit board 500 may be disposed on the second pads. The printed circuit board 500 and the data driving integrated circuit 400 may be electrically connected to each other through the second pads.

The window member 100 may be disposed on the display panel 300 and may cover the outer side of the display panel 300. The window member 100 may have substantially the same shape as the display panel 300. The window member 100 may include a planar portion 100PS, a first side portion 100SS1, a second side portion 100SS2, a third side portion 100SS3, a fourth side portion 100SS4, a first edge portion 100ES1, a second edge portion 100ES2, a third edge portion 100ES3, and a fourth edge portion 100ES4.

The window member 100 may include or be made of a transparent material. The window member 100 may include or be made of, for example, glass or plastic. In ana embodiment where the window member 100 includes plastic, the window member 100 may have flexible properties.

The window member 100 may include, but is not limited to, at least one selected from: polyimide, polyacrylate, polymethyl methacrylate (PMMA), polycarbonate (PC), polyethylene naphthalate (PEN), polyvinylidene chloride, polyvinylidene difluoride (PVDF), polystyrene, ethylene vinyl alcohol copolymer, polyethersulphone, polyetherimide (PEI), polyphenylene sulfide (PPS), polyacrylate, tri-acetyl cellulose (TAC), and cellulose acetate propionate (CAP). The plastic window member 100 may include one or more of the plastic materials listed above.

In an embodiment where the window member 100 includes plastic, the window member 100 may further include coating layers (not shown) disposed on the upper and lower surfaces of the plastic. In one embodiment, the coating layers may be hard-coating layers including an organic layer including an acrylate compound and/or an organic-inorganic composite layer. The organic layer may include an acrylate compound. The organic-inorganic composite layer may be a layer in which an inorganic material, such as silicon oxide, zirconium oxide, aluminum oxide, tantalum oxide, niobium oxide, glass bead, or the like is dispersed in an organic material, such as an acrylate compound. In an alternative embodiment, the coating layers may include a metal oxide layer. The metal oxide layer may include a metal oxide such as titanium oxide, aluminum oxide, molybdenum oxide, tantalum oxide, copper oxide, indium oxide, tin oxide, and tungsten oxide, but is not limited thereto.

The planar portion 100PS of the window member 100 may correspond to the planar portion PS of the display panel 300, the side portions 100SS1 to 100SS4 of the window member 100 may correspond to the side portions SS1 to SS4 of the display panel 300 disposed adjacent thereto, and the edge portions 100ES1 to 100ES4 of the window member 100 may correspond to the edge portions ES1 to ES4 of the display panel 300 disposed adjacent thereto. The shapes of the respective corresponding portions are substantially to the same as each other, and thus any repetitive detailed descriptions thereof will be omitted.

Referring to FIG. 4, an embodiment of the display device 1 may further include a support member 350 disposed on the display panel 300. An adhesive member may be further disposed between the support member 350 and the display panel 300. The adhesive member may include a conventional adhesive or pressure sensitive adhesive. The support member 350 may be disposed over the entire surface of the display panel 300. That is, the support member 350 may have substantially the same planar shape and size as the display panel 300. The support member 350 may be divided into a plurality of portions that correspond to the plurality of portions PS, ES2, SS2, and PES of the display panel 300.

In an embodiment, for example, the support member 350 may include: a first portion 351 that corresponds to the planar portion PS, the second edge portion ES2, and the second side portion SS2; a second portion 353 that corresponds to the first bent portion BS1; a third portion 355 that corresponds to the first flat portion FS1; a fourth portion 357 that corresponds to the second bent portion BS2; and a fifth portion 359 that corresponds to the second flat portion FS2.

The first portion 351 may be disposed on second surfaces (also referred to as "the other surfaces") of a first substrate portion 311 to a third substrate portion 313, the second portion 353 may be disposed on a second surface of a fourth substrate portion 314, the third portion 355 may be disposed on a second surface of a fifth substrate portion 315, the fourth portion 357 may be disposed on a second surface of a sixth substrate portion 316, and the fifth portion 359 may be disposed on a second surface of a seventh substrate portion 317.

Each of the portions 351, 353, 355, 357, and 359 of the support member 350 may have substantially the same planar shape and size as each of the corresponding portions PS, ES2, SS2, BS1, FS1, BS2, and FS2 of the display panel 300. The portions 351, 353, 355, 357, and 359 of the support member 350 may be integrally formed with each other as a single unitary indivisible part. As described above, the display panel 300 may be bent in each of the bent portions BS1 and BS2 in a predetermined direction, and stress generated in the bent portions may be greater than stress generated in the flat portion. Since the support member 350 disposed over the entire surface of the display panel 300 is bonded to the display panel 300 and bent together, the stress may vary according to the physical properties, arrangement, and shape of the support member 350. Accordingly, in an embodiment, the support member 350 may be formed in a way such that the thicknesses of the portions 353 and 357 respectively bonded to the bent portions BS1 and BS2 of the display panel 300 are less than the thicknesses of the other adjacent portions 351, 355, and 359, thereby reducing the stress of the display device 1 generated in the multi-bent portion PES. The thickness and shape of each of the portions 351, 353, 355, 357, and 359 of the support member 350 will be described below.

FIG. 5 illustrates a primary bending state in which the second edge portion ES2 of the display panel 300 is bent and the multi-bent portion PES is unfolded, FIG. 6 illustrates a secondary bending state in which the second edge portion ES2 and the first bent portion BS1 of the display panel 300 are bent and the first flat portion FS1, the second bent portion BS2, and the second flat portion FS2 are unfolded, and FIG. 7 illustrates a tertiary bending state in which the second edge portion ES2, the first bent portion BS1, and the second bent portion BS2 of the display panel 300 are bent.

First, referring to FIG. 5, in the primary bending state, the flexible substrate 310 may be disposed along the planar portion PS, the second edge portion ES2, the second side portion SS2, and the multi-bent portion PES of the display panel 300. The flexible substrate 310 may include the first substrate portion 311 disposed along the planar portion PS, the second substrate portion 312 disposed along the second edge portion ES2, the third substrate portion 313 disposed along the second side portion SS2, the fourth substrate portion 314 disposed along the first bent portion BS1, the fifth substrate portion 315 disposed along the first flat portion FS1, the sixth substrate portion 316 disposed along the second bent portion BS2, and the seventh substrate portion 317 disposed along the second flat portion FS2.

The second substrate portion 312 of the flexible substrate 310 may be bent in a way such that the third substrate portion 313 is bent from the first substrate portion 311, extending in the first direction DR1, toward the other side in the third direction DR3, and the third substrate portion 313 to the seventh substrate portion 317 of the flexible substrate 310 may be extended in the other side in the third direction DR3.

The flexible substrate 310 may have a first surface (also referred to as "one surface") facing the window member 100 and the second surface that is opposite to the first surface.

The support member 350 described above may be disposed on the second surface of the flexible substrate 310. The support member 350 and the flexible substrate 310 may be bonded to each other by an adhesive member or the like disposed between the support member 350 and the second surface of the flexible substrate 310.

The first portion 351 of the support member 350 may be disposed on the second surfaces of the first substrate portion 311, the second substrate portion 312, and the third substrate portion 313, the second portion 353 may be disposed on the second surface of the fourth substrate portion 314, the third portion 355 may be disposed on the second surface of the fifth substrate portion 315, the fourth portion 357 may be disposed on the second surface of the sixth substrate portion 316, and the fifth portion 359 may be disposed on the second surface of the seventh substrate portion 317.

The thickness of the second portion 353 of the support member 350 may be less than the thicknesses of the first portion 351 and the third portion 355. Further, the thickness of the fourth portion 357 of the support member 350 may be less than the thicknesses of the third portion 355 and the fifth portion 359 adjacent thereto.

In an embodiment, as shown in FIG. 8, the first portion 351 may have a first thickness t1 from the second surface of the third substrate portion 313 of the flexible substrate 310. In In such an embodiment, a surface 351a of the first portion 351 may have a surface height corresponding to the first thickness t1 from the second surface of the third substrate portion 313.

The third portion 355 may have the first thickness t1 from the second surface of the fifth substrate portion 315 of the flexible substrate 310. In such an embodiment, a surface 355a of the third portion 355 may have a surface height corresponding to the first thickness t1 from the first surface of the fifth substrate portion 315.

The fifth portion 359 may have the first thickness t1 from the second surface of the seventh substrate portion 317 of the flexible substrate 310. In such an embodiment, a surface 359a of the fifth portion 359 may have a surface height corresponding to the first thickness t1 from the first surface of the seventh substrate portion 317.

The second portion 353 may have a second thickness t2 from the second surface of the fourth substrate portion 314. In such an embodiment, a surface of the second portion 353 may have a surface height corresponding to the second thickness t2 from the second surface of the fourth substrate portion 314.

The fourth portion 357 may have a third thickness t3 from the second surface of the sixth substrate portion 316. In such an embodiment, a surface of the fourth portion 357 may have a surface height corresponding to the third thickness t3 from the first surface of the sixth substrate portion 316.

The second thickness t2 may be less than the first thickness t1. Further, the third thickness t3 may be less than the first thickness t1. such an embodiment, the second portion 353 and the fourth portion 357 may be recessed portions which have the surface heights recessed below the surfaces of the adjacent portions 351, 355, and 359.

The recessed portions may be formed by thermal compression using a heat block, which will be described below, in the manufacturing process. When the heat block having a tip with the same shape, width, and compression depth is used, the second portion 353 and the fourth portion 357 may be formed to have the same thickness and width as each other. In this case, the second thickness t2 and the third thickness t3 may be equal to each other, the second portion 353 may have a first width w1 and the fourth portion 357 may have a second width w2. The first width w1 and the second width w2 may be equal to each other.

Burrs 361 or burr shaped portions may be further located on the surface 351a of the first portion 351, the surface 355a of the third portion 355, and the surface 359a of the fifth portion 359. The burrs 361 may have a shape protruding in the thickness direction from the surface 351a, 355a, and 359a. When the recessed portions 353 and 357 are formed through the above-described heat block, a material of the support member 350 in the corresponding portions may be melted by the heat of the heat block and moved, which may form the burrs 361.

The optical member 370 may be further disposed between the flexible substrate 310 and the window member 100. The optical member 370 may be disposed on the first substrate portion 311 to the third substrate portion 313, a portion thereof may be disposed on the fourth substrate portion 314. The optical member 370 may not be disposed on the fifth substrate portion 315 to the seventh substrate portion 317.

The optical member 370 may include a polarizing film.

A bending protective layer 380 may be further disposed between the optical member 370 and the data driving integrated circuit 400. The bending protective layer 380 may be in contact with one side surface of the optical member 370 and may not be in contact with the data driving integrated circuit 400.

As shown in FIG. 6, an embodiment of the display panel 300 is subjected to secondary bending after primary bending. During the secondary bending, as the first bent portion BS1 is bent at a predetermine curvature from the second side portion SS2 extending in the third direction DR3, the fourth substrate portion 314 may be bent at a first curvature from the third substrate portion 313 extending in the third direction DR3. Accordingly, the second surfaces of the fifth substrate portion 315 to the seventh substrate portion 317 may face the second surface of the first substrate portion 311. The first curvature may be less than a second curvature which will be described below. That is, the fourth substrate portion 314 and the second portion 353 bonded thereto may be bent at a curvature that is less than the curvature of the sixth substrate portion 316 and the fourth portion 357 bonded thereto.

The support member 350 may have a first surface (also referred to as "one surface") facing the flexible substrate 310 and a second surface (also referred to as "the other surface") that is an opposite surface of the first surface defined.

When the secondary bending is performed, the second surfaces of the third portion 355, the fourth portion 357, and the fifth portion 359 may each face the second surface of the first portion 351.

As described above, the second portion 353 of the support member 350 has a thickness smaller than those of the adjacent first portion 351 and the third portion 357, so that, during the secondary bending, the occurrence of bending stress may be reduced by the second portion 353 of the support member 350.

Then, as shown in FIG. 7, the display panel 300 is subjected to tertiary bending after the secondary bending. During the tertiary bending, as the second bent portion BS2 is bent at a predetermine curvature from the first flat portion FS1 extending in the third direction DR3, the sixth substrate portion 316 may be bent at a predetermined curvature from the fifth substrate portion 315 extending in the third direction DR3. Accordingly, the second surface of the fifth substrate portion 315 may face the second surface of the third substrate portion 313, and the second surface of the seventh substrate portion 317 may face the second surface of the first substrate portion 311.

When the tertiary bending is performed, the second surface of the third portion 355 may face the second surface of the first portion 351. In some embodiments, the second surface of the third portion 355 may be in contact with the second surface of the first portion 351. In addition, although the second surface of the fourth portion 357 and the second surface of the first portion 351 may face each other, the second surface of the fourth portion 357 and the second surface of the first portion 351 may not be in contact with each other as shown in FIG. 8. In addition, the second surface of the fifth portion 359 may face the second surface of the first portion 351. In some embodiments, the second surface of the fifth portion 359 may be in contact with the second surface of the first portion 351.

In some embodiments, the second surface of the fourth portion 357 and the second surface of the first portion 351 are not in contact with each other, while the second surface of the adjacent third portion 355 and the second surface of the first portion 351 are in contact with each other and the second surface of the fifth portion 359 and the second surface of the first portion 351 are in contact with each other. Accordingly, the second surface of the fourth portion, the side surface of the adjacent third portion 355, the side surface of the fifth portion 359, and the second surface of the first portion 351 may form an empty space, or a void.

As a result, as shown in FIG. 7, the first bent portion BS1 is substantially inverted approximately 180 degrees along the first curvature so that the second surface of the portion of the second portion 353 in contact with the second side portion SS2 and the second surface of the portion of the second portion 353 in contact with the first flat portion FS1 may face each other. In addition, the second bent portion BS2 may be substantially bent at approximately 90 degrees along the second curvature.

The data driving integrated circuit 400 and the printed circuit board 500 may be disposed to overlap the first substrate portion 311.

As described above, in embodiments, the fourth portion 357 of the support member 350 has a thickness smaller than those of the third portion 355 and the fifth portion 359 adjacent thereto, so that, during the tertiary bending, the occurrence of bending stress may be reduced by the fourth portion 357 of the support member 350.

According to embodiments of the display device 1, the support member 350 bonded onto the display panel 300 is not subjected to processing, such as reducing thickness or the like, except for the second portion 353 and the fourth portion 357 that are bent portions, so that the area of an empty space or void formed inside the support member 350 may be substantially reduced even when the secondary bending and the tertiary bending are performed. If the area of the empty space or void formed inside the support member 350 is large, foreign substances and/or moisture may enter through the empty space or the void. In such embodiments, the support member 350 may have the recessed portions selectively formed only in the portions where the secondary bending and the tertiary bending are performed, so that an undesired increase in the formation area of an empty space or a void can be prevented, thereby effectively preventing the introduction of foreign substances and/or moisture permeation.

Hereinafter, a method for manufacturing a display device according to an embodiment will be described in detail. In such an embodiment, the same or like components as those of the above-described embodiment are labeled by the same reference numerals, and any repetitive detailed description thereof will be omitted or simplified for descriptive convenience.

Figure 9:
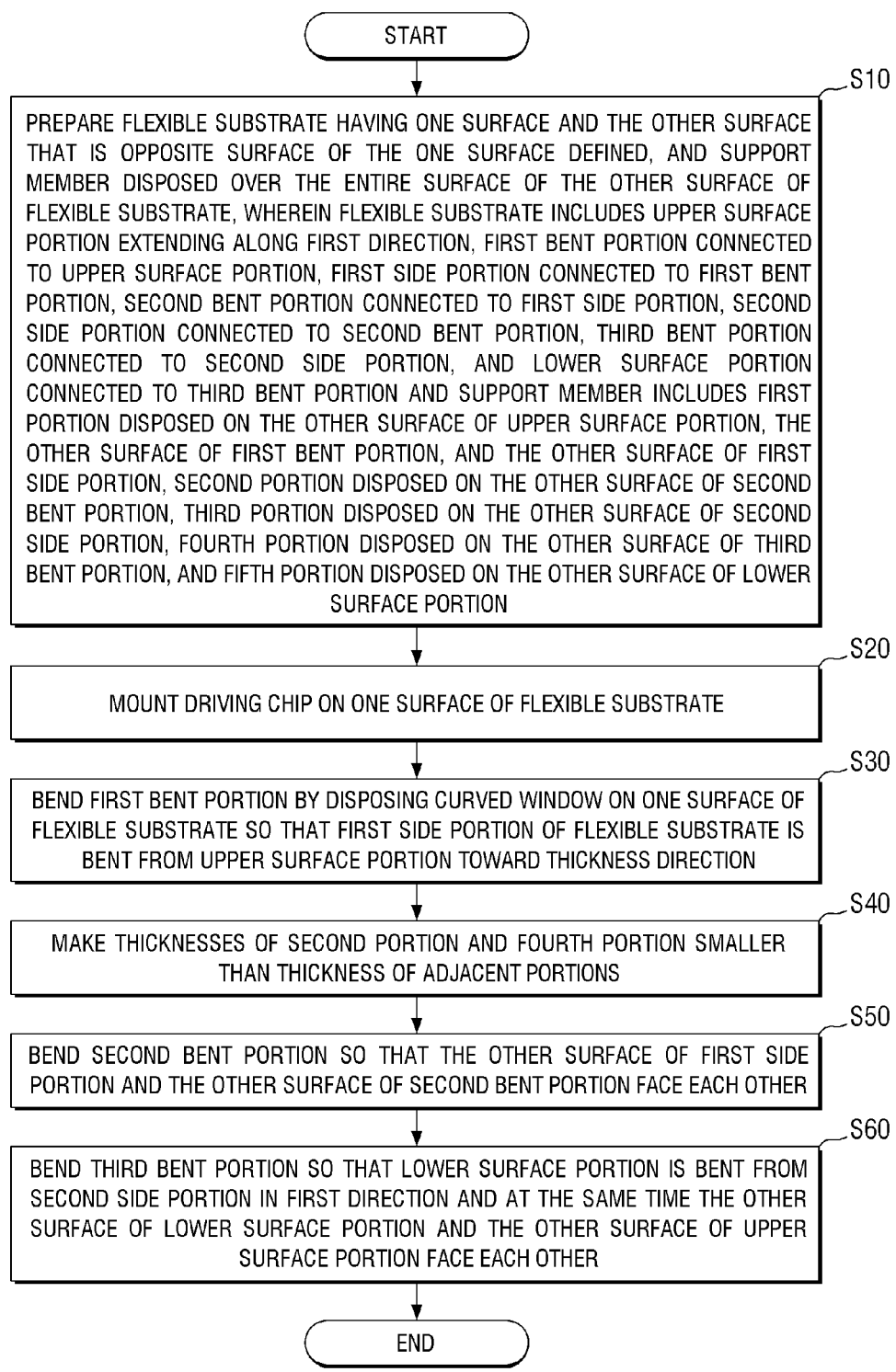
FIG. 9 is a flowchart illustrating a method for manufacturing a display device according to an embodiment.

FIG. 9 is a flowchart illustrating a method for manufacturing a display device according to an embodiment, and FIGS. 10 to 13 are sequential cross-sectional views illustrating a method for manufacturing a display device according to an embodiment.

Figure 10:
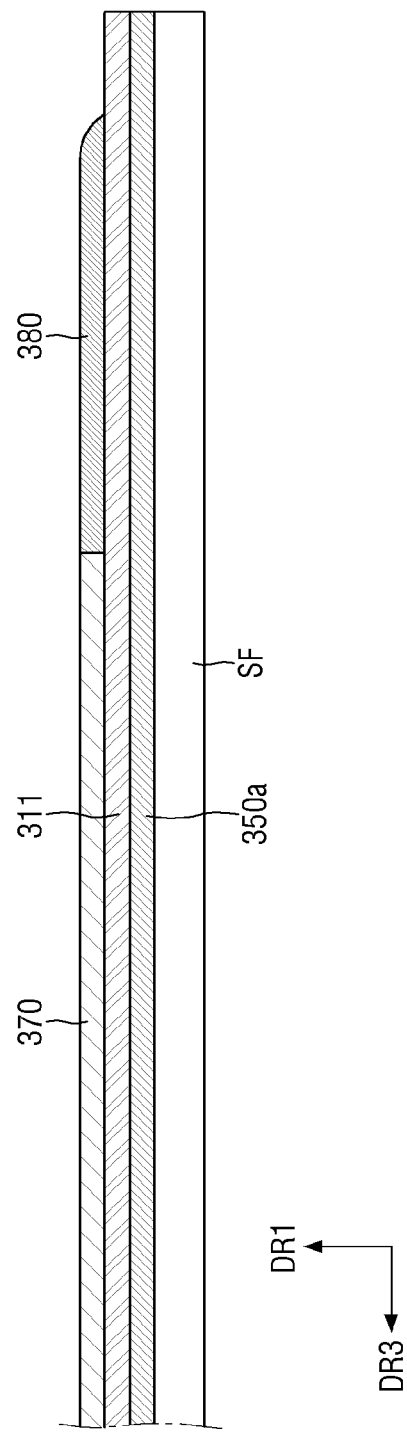
FIGS. 10 to 13 are sequential cross-sectional views illustrating a method for manufacturing a display device according to an embodiment.

Referring to FIGS. 9 and 10 in conjunction with FIGS. 5 to 7, in an embodiment of a method for manufacturing a display device, the flexible substrate 310, which has a first surface (also referred to as "one surface") and a second surface (also referred to as "the other surface") that is an opposite surface of the first surface, and the support member 350a disposed over the entire surface of the second surface of the flexible substrate 310 are prepared, where the flexible substrate 310 includes the first substrate portion 311 extending in the first direction DR1, the second substrate portion 312 connected to the first substrate portion 311, the third substrate portion 313 connected to the second substrate portion 312, the fourth substrate portion 314 connected to the third substrate portion 313, the fifth substrate portion 315 connected to the fourth substrate portion 314, the sixth substrate portion 316 connected to the fifth substrate portion 315, and the seventh substrate portion 317 connected to the sixth substrate portion 316, and the support member 350a includes the first portion 351 disposed on the second surfaces of the first substrate portion 311 to the third substrate portion 313, the second portion 353 disposed on the second surface of the fourth substrate portion 314, the third portion 355 disposed on the second surface of the fifth substrate portion 315, the fourth portion 357 disposed on the second surface of the sixth substrate portion 316, and the fifth portion 359 disposed on the second surface of the seventh substrate portion 317 (S10).

As shown in FIG. 10, in the operation S10 of preparing the flexible substrate 310 and the support member 350a, the first substrate portion 311 to the seventh substrate portion 317 are extended in the first direction DR1 without being bent.

In such an embodiment, the first portion 351 to the fifth portion 359 are extended in the first direction DR1 without being bent during the preparation operation. The support member 350a may have a first surface (also referred to as "one surface") facing the flexible substrate 310 and a second surface (also referred to as "the other surface") that is the opposite surface of the first surface, and the second surfaces of the first portion 351 to the fifth portion 359 may be flat.

A carrier film SF may be further disposed on the second surface of the support member 350a.

Figure 11:
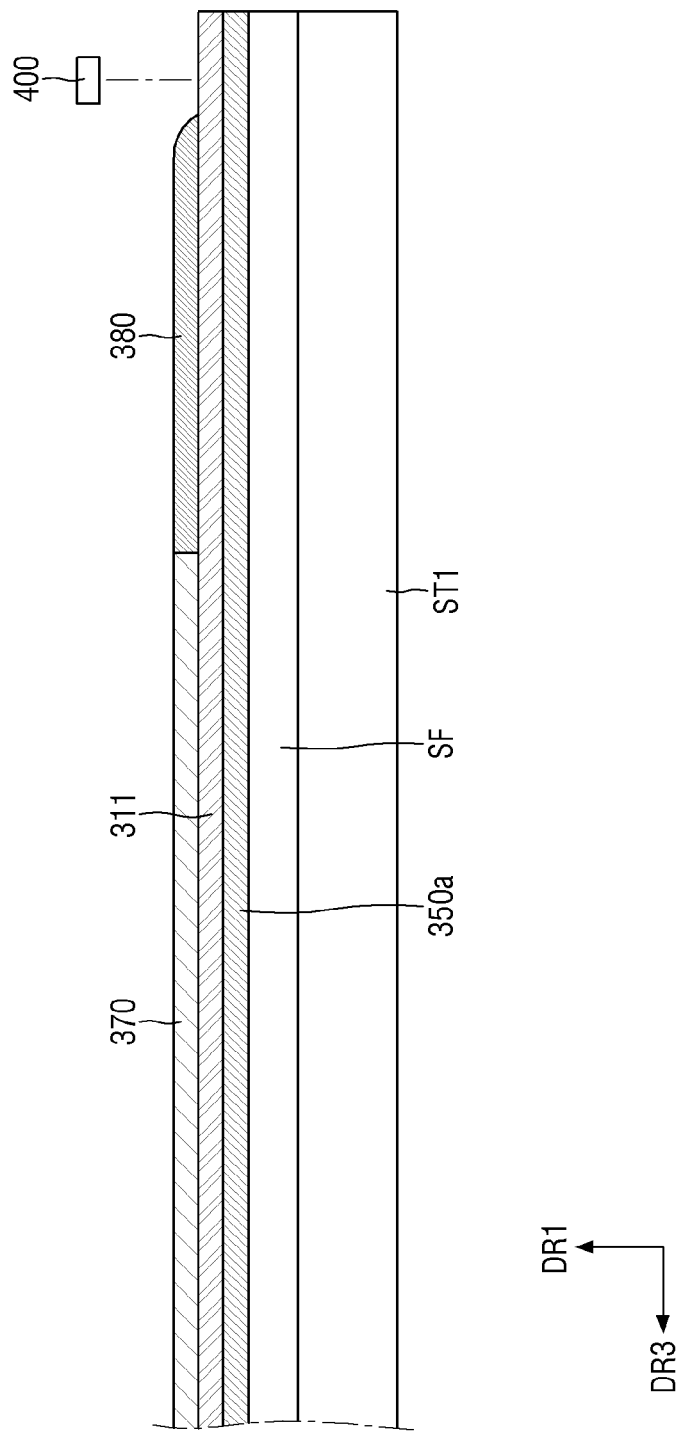

Referring to FIGS. 9 and 11 in conjunction with FIG. 4, the data driving integrated circuit 400 is disposed on the first surface of the pad area of the flexible substrate 310 (S20). The portion where the data driving integrated circuit 400 may be the second flat portion FS2 of FIG. 4 as described above.

In the operation S20 of disposing the data driving integrated circuit 400 may be performed after a first stage ST1 is disposed on the other side of the carrier film SF in the third direction DR3.

According to an embodiment of the method for manufacturing a display device, an operation of forming a recessed portion in the support member 350a is performed after the operation of mounting the data driving integrated circuit 400, and thus the thickness of the support member 350a is uniform on the multi-bent portion PES of the display device 1. Accordingly, when the data driving integrated circuit 400 is mounted, a step difference between the portion corresponding to the bent portion of the support member 350a and the adjacent portion may not occur, and thus the data driving integrated circuit 400 may be more easily mounted.

When the above operation is complete, the first stage ST1 is removed and the carrier film SF is peeled off from the support member 350a.

Figure 12:
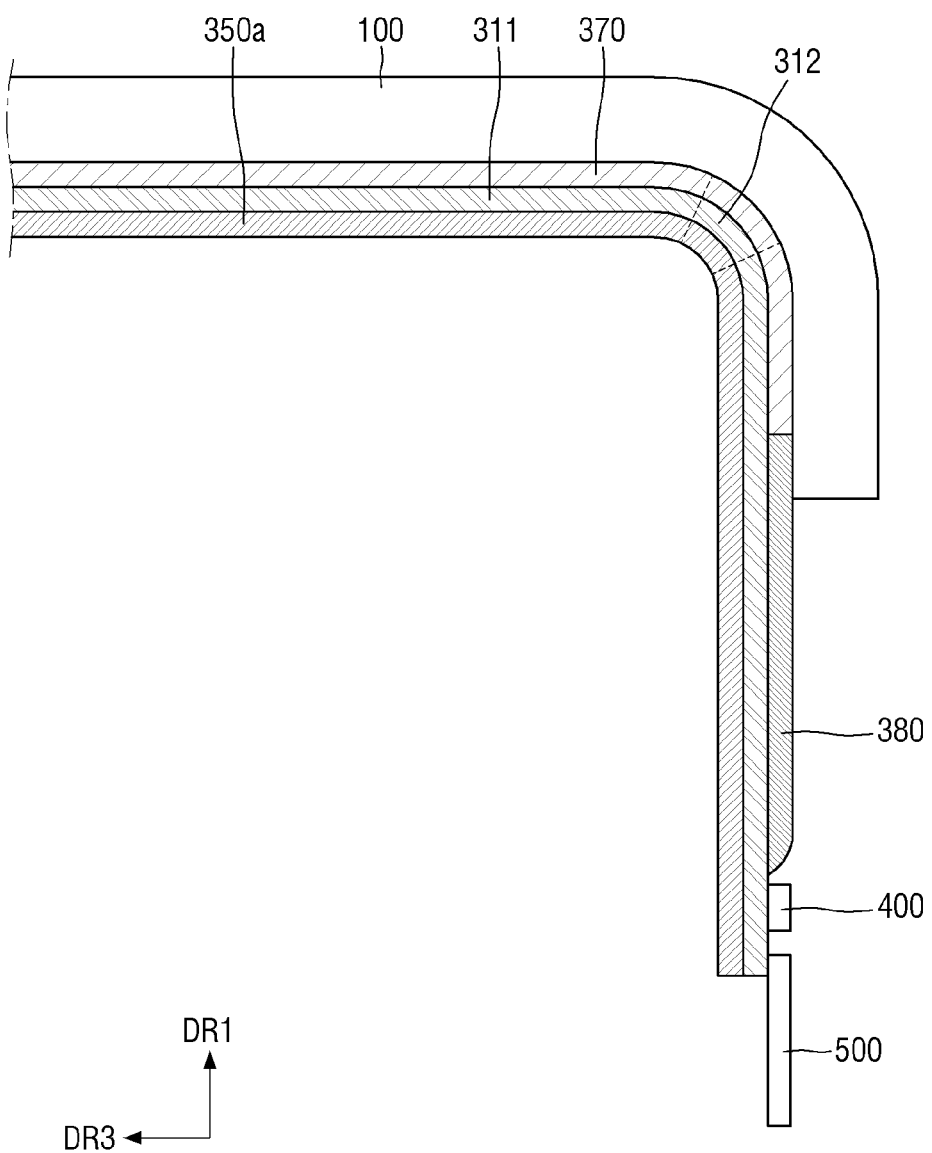

Then, referring to FIGS. 9 and 12, the second substrate portion 312 of the flexible substrate 310 is subjected to a primary bending (S30).

In one embodiment, the operation of bending the second substrate portion 312 may include bending the second substrate portion 312 along the curved surface of a curved window 100 by disposing the curved window member 100 on the first surface of the flexible substrate 310.

When the second substrate portion 312 is subjected to the primary bending, the second substrate portion 312 is bent from the first substrate portion 311, extending in the first direction DR1, toward the other side in the third direction DR3, so that the portions spaced apart from the first substrate portion 311 with the second substrate portion 312 interposed therebetween may extend in the third direction DR3. The flexible substrate 310 and the support member 350a have substantially the same shape as each other except that the second portion 353 and the fourth portion 357 do not have a recessed portion, and thus any repetitive detailed description thereof will be omitted.

Figure 13:
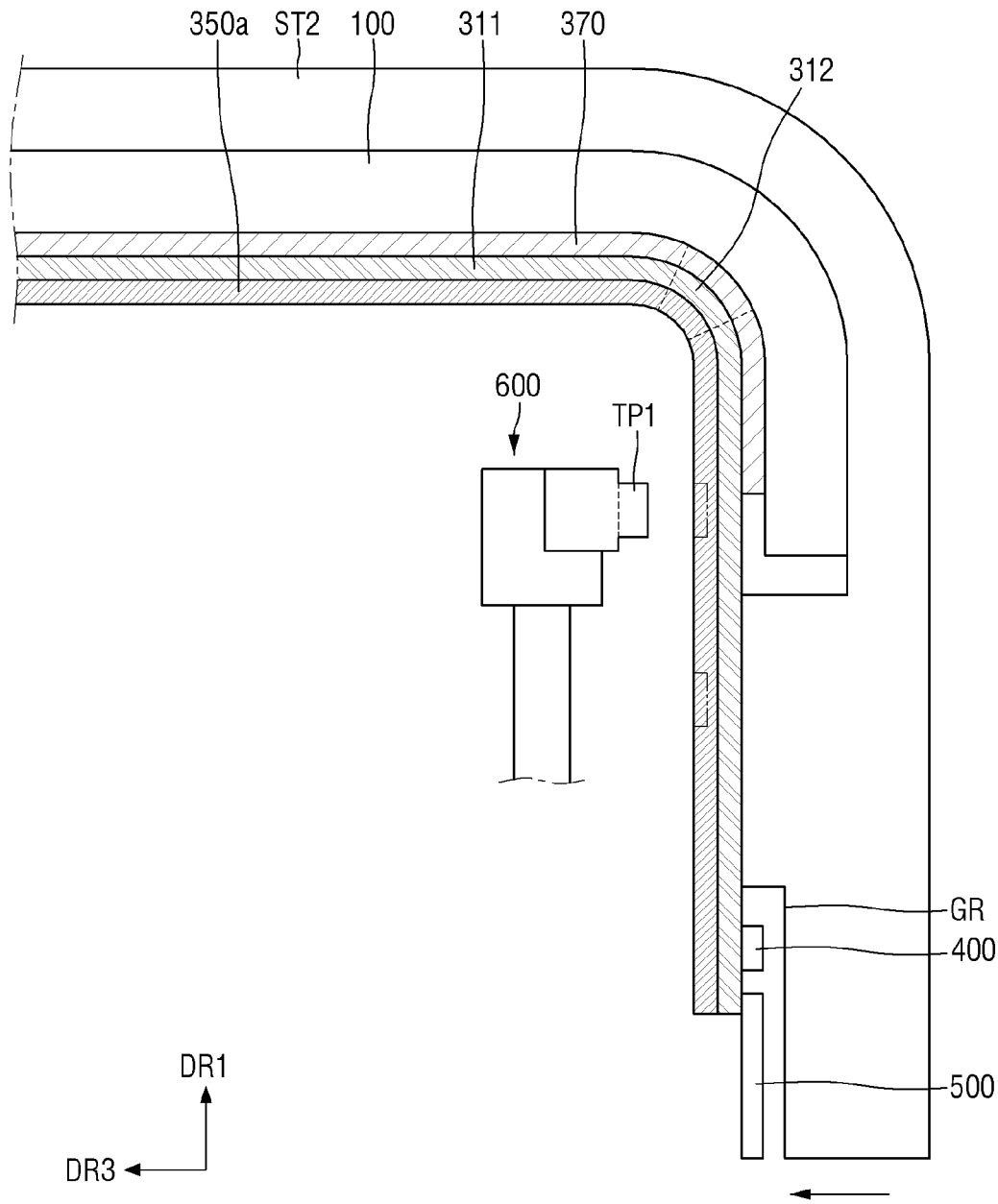

Then, referring to FIGS. 9 and 13, in conjunction with FIG. 5, the thicknesses of the second portion 353 and the fourth portion 357 are made smaller than those of the portions 351, 355, and 359 adjacent thereto (S40).

In an embodiment, the operation S40 may include forming a recessed portion in each of the second portion 353 and the fourth portion 357.

The operation S40 of making the thicknesses of the second portion 353 and the fourth portion 357 smaller than those of the portions 351, 355, and 359 adjacent thereto may be performed by using a heat block 600. The heat block 600 may include a first tip portion TP1. The heat block 600 moves in the first direction DR1 and applies heat when the first tip portion TP1 comes into contact with the support member 350a and applies pressure to the support member 350a. The support member 350a may have a recessed portion that corresponds to the first tip portion TP1 of the heat block 600. When the pressure is applied to the support member 350a through the heat block 600, the display device including the support member 350a may be pushed away in the direction in which the pressure is applied. Accordingly, in an embodiment, a second stage ST2 may be disposed on the outer side of the display device (i.e., on the upper surface of the window member 100 and one the display surface of the display panel 300) to prevent the support member 350a from being pushed away in the direction in which the pressure is applied. The second stage ST2 partially in contact with the outer profile of the display device may fix the display device to which a pressure is applied by the heat block 600 to prevent the display device from being pushed away. Since physical damage occurs when the corresponding area where the data driving integrated circuit 400 and the printed circuit board 500 are disposed is in direct contact with the second stage ST2, the second stage ST2 may further include a groove GR recessed toward another aide in the first direction DR1 to avoid interference or direct contact with the data driving integrated circuit 400 and the printed circuit board 500.

The operation of forming the recessed portion in each of the second portion 353 and the fourth portion 357 may be performed by forming the recessed portion in the fourth portion 357 after forming the recessed portion in the second portion 353, but the disclosure is not limited to this order.

After the above operations, the display device described in FIG. 5 is formed. The shape of the support member 350a is described above with reference to FIG. 5, and hence any repetitive detailed description thereof will be omitted hereinafter.

Then, the display device is subjected to a secondary bending (S50).

The secondary bending S50 of the display device is substantially the same as that described above with reference to FIG. 6, and hence any repetitive detailed description thereof will be omitted.

Then, the display device is subjected to a tertiary bending (S60).

The tertiary bending S60 of the display device is substantially the same as that described above with reference to FIG. 7, and hence any repetitive detailed description thereof will be omitted.

In an embodiment, the method for manufacturing a display device may further include disposing a lower cover member, such as a heat dissipation sheet or the like, on the second surface of the first portion of the support member 350a between the operation S30 of performing the primary bending of the second substrate portion 312 of the flexible substrate 310, the operation S40 of making the thickness of the fourth portion 357 smaller than the thicknesses of the adjacent portions 351, 355, and 359. In the above operation, the support member 350a may not have a recessed portion and have the equal surface height, and thus there is no room for the support member 350a to float, so that the lower cover member can be easily attached.

Figure 14:
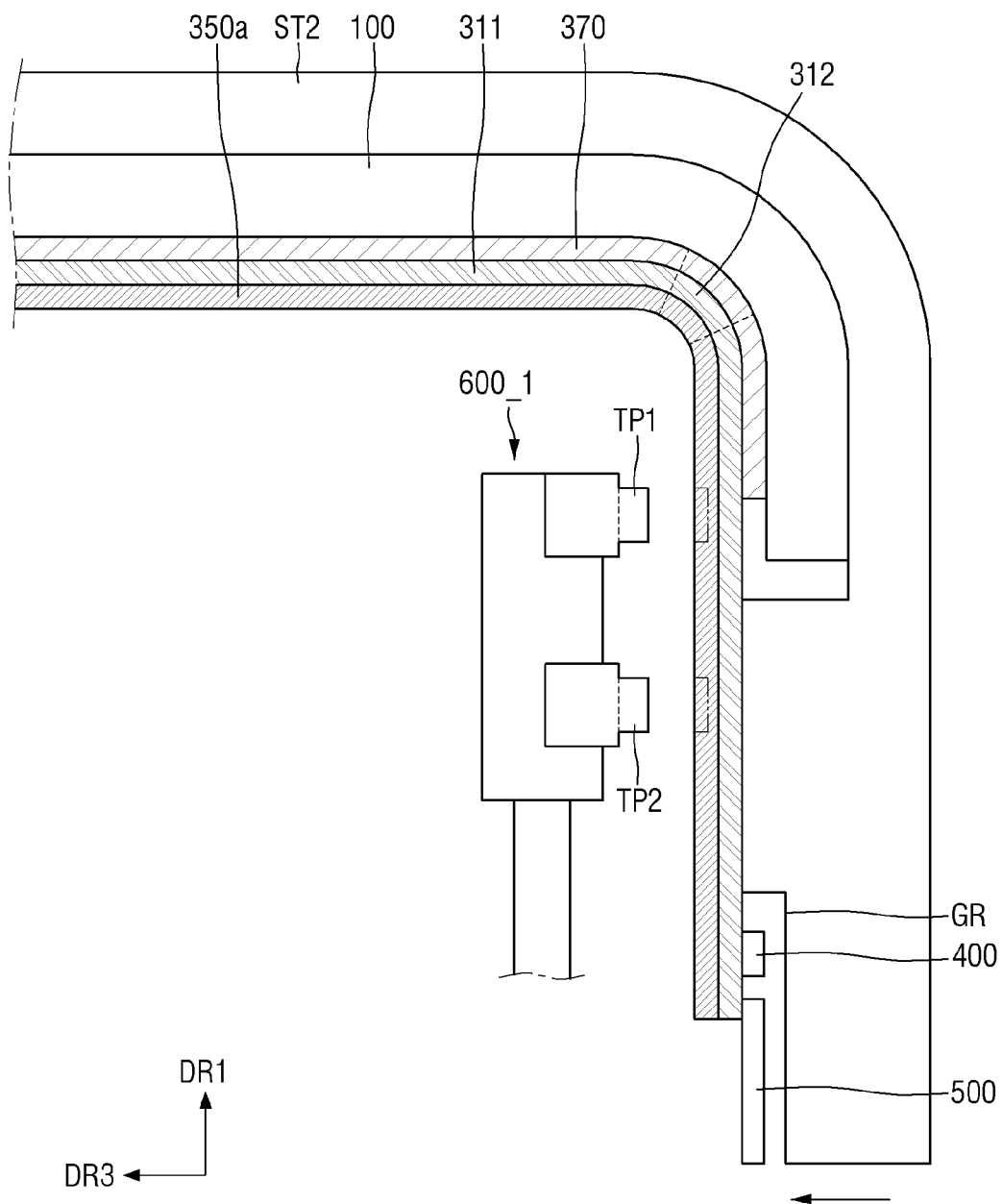
FIG. 14 is a cross-sectional view illustrating a process of a method for manufacturing a display device according to an alternative embodiment.

FIG. 14 is a cross-sectional view illustrating a process of a method for manufacturing a display device according to an alternative embodiment.

The embodiment of the method for manufacturing a display device of FIG. 14 is substantially the same as the method for manufacturing a display device according to the embodiment of FIG. 9 except that recessed portions are formed simultaneously in a second portion 353 and a fourth portion 357. In such an embodiment, a heat block 600_1 includes a first tip portion TP1 and a second tip portion TP2.

Hereinafter, a method for manufacturing a display device according to an alternative embodiment will be described. In the following embodiment, the same or like components as those of the above-described embodiment are labeled by the same reference numerals, and any repetitive detailed description thereof will be omitted or simplified for descriptive convenience.

Figure 15:
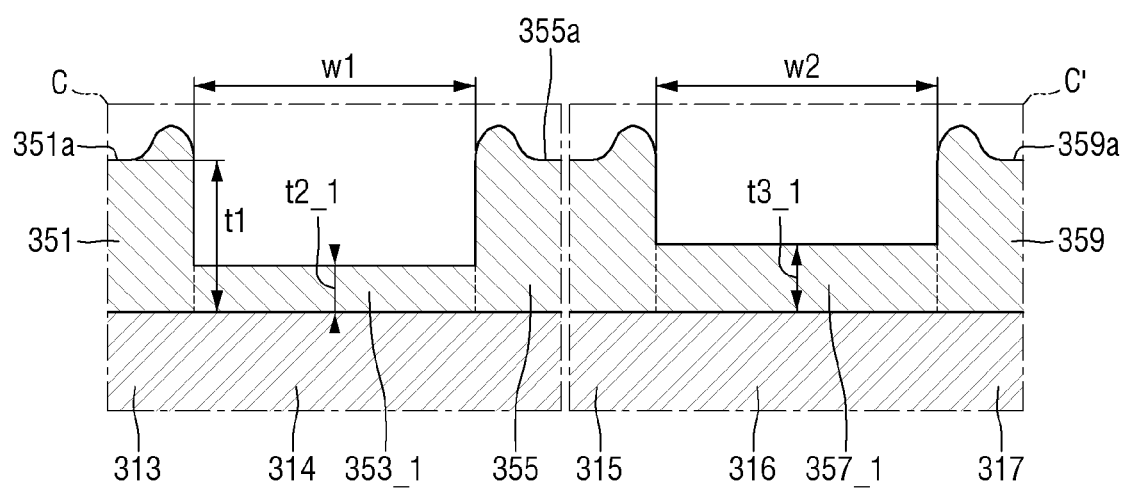
FIG. 15 is a cross-sectional view according to an alternative embodiment based on the embodiment of FIG. 7.

FIG. 15 is a cross-sectional view according to an alternative embodiment based on the embodiment of FIG. 7.

The embodiment of the display device of FIG. 15 is substantially the same as the display device of FIG. 8 except that a second thickness t2_1 of a second portion 353_1 is smaller than a third thickness t3_1 of a fourth portion 357_1.

As described with reference to FIGS. 7 and 8, the second portion 353_1 is bent at a curvature that is less than that of the fourth portion 357_1, and thus when the thickness of the second portion 353_1 is made smaller than the thickness of the fourth portion 357_1, the overall bending stress of the display device may be reduced.

Figure 16:
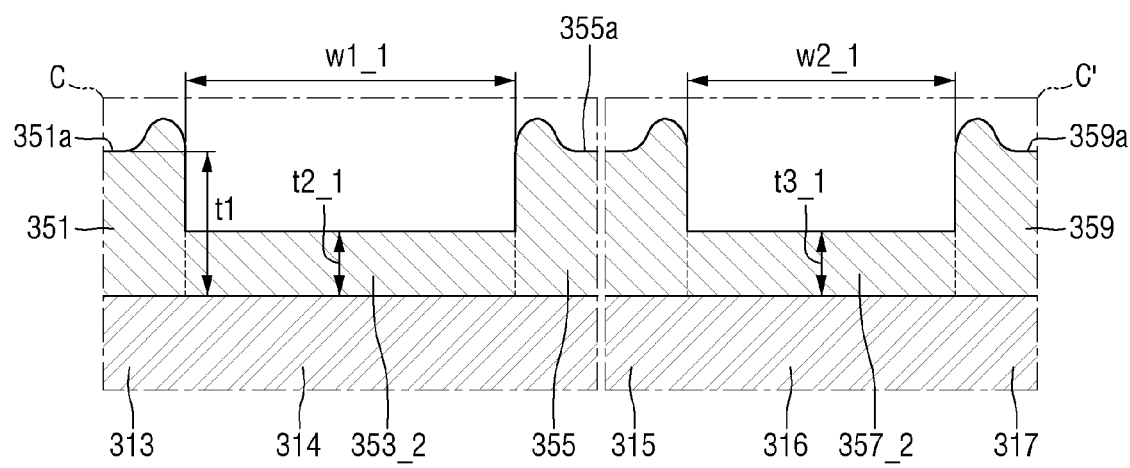
FIG. 16 is a cross-sectional view according to an alternative embodiment based on the embodiment of FIG. 7.

FIG. 16 is a cross-sectional view according to an alternative embodiment based on the embodiment of FIG. 7.

The embodiment of the display device of FIG. 16 is substantially the same as the embodiment of FIG. 8 except that a first width w1_1 of a second portion 353_2 is greater than a second width w2_1 of a fourth portion 357_2.

In such an embodiment, other features or components are the same as those described above with reference to FIG. 8, and thus any repetitive detailed descriptions thereof will be omitted.

Figure 17:
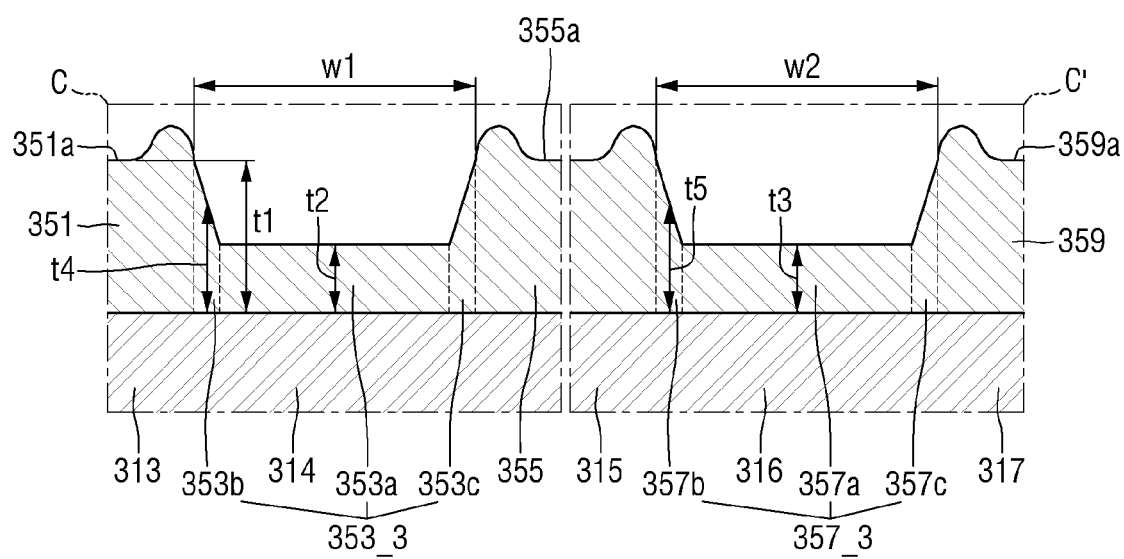
FIG. 17 is a cross-sectional view according to an alternative embodiment based on the embodiment of FIG. 7.

FIG. 17 is a cross-sectional view according to an alternative embodiment based on the embodiment of FIG. 7.

The embodiment of the display device of FIG. 17 is substantially the same as the embodiment of FIG. 8 except that a second portion 353_3 includes a second-first portion 353a having a second thickness t2, a second-second portion 353b positioned between the second-first portion 353a and a first portion 351, and a second-third portion 353c positioned between the second-first portion 353a and a third portion 355 and a fourth portion 357_3 includes a fourth-first portion 357a having a third thickness t3, a fourth-second portion 357b positioned between the fourth-first portion 357a and the third portion 355, and a fourth-third portion 357c positioned between the fourth-first portion 357a and a fifth portion 359.

In such an embodiment, the second-first portion 353a may have the second thickness t2, and the second-second portion 353b and the second-third portion 353c may each have a fourth thickness t4. The fourth thickness t4 may have a value between the second thickness t2 and the first thickness t1. The fourth thickness t4 may gradually increase as the distance from the second-first portion 353a increases.

In such an embodiment, the fourth-first portion 357a may have the third thickness t3, and the fourth-second portion 357b and the fourth-third portion 357c may each have a fifth thickness t5. The fifth thickness t5 may have a value between the third thickness t3 and the first thickness t1. The fifth thickness t5 may gradually increase as the distance from the fourth-first portion 357a increases.

Figure 18:
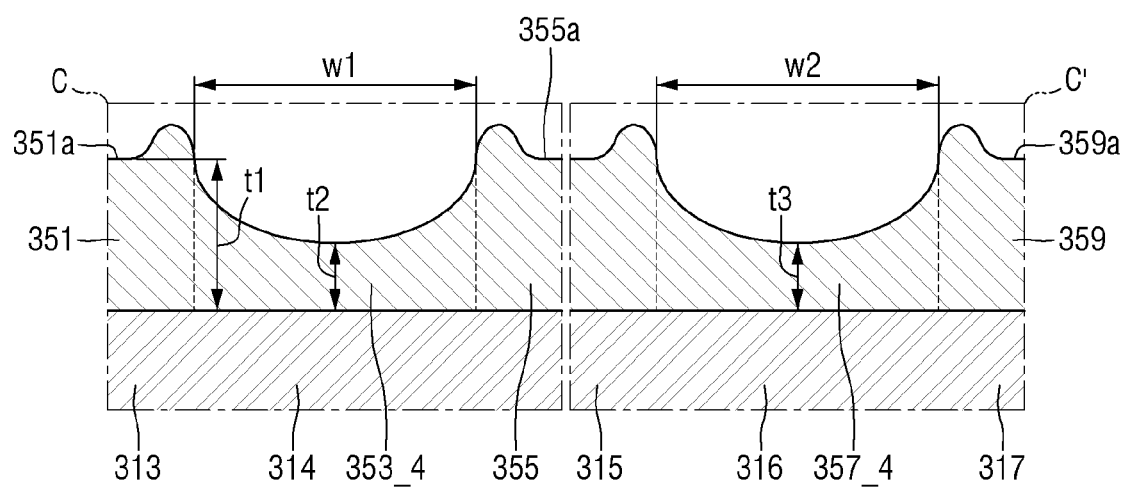
FIG. 18 is a cross-sectional view according to an alternative embodiment based on the embodiment of FIG. 7.

FIG. 18 is a cross-sectional view according to an alternative embodiment based on the embodiment of FIG. 7.

The embodiment of the display device of FIG. 18 is substantially the same as the embodiment of FIG. 8 except that a second portion 353_4 and a fourth portion 357_4 have curved surfaces.

In such an embodiment, other features or components are the same as those described above with reference to FIG. 8, and thus any repetitive detailed descriptions thereof will be omitted.

Figure 19:
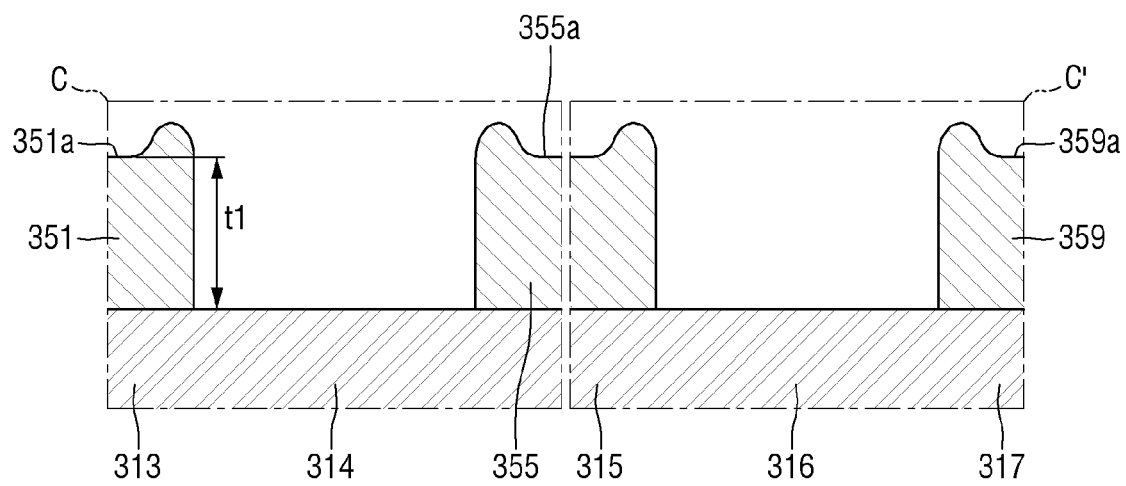
FIG. 19 is a cross-sectional view according to an alternative embodiment based on the embodiment of FIG. 7.

FIG. 19 is a cross-sectional view according to an alternative embodiment based on the embodiment of FIG. 7.

The embodiments of the display device of FIG. 19 is substantially the same as the embodiment of FIG. 8 except that the second portion 353 and the fourth portion 357 of FIG. 8 are not disposed.

In such an embodiment, a support member may not be disposed on the second surface of the fourth substrate portion 314 and the second surface of the sixth substrate portion 316.

Figure 20:
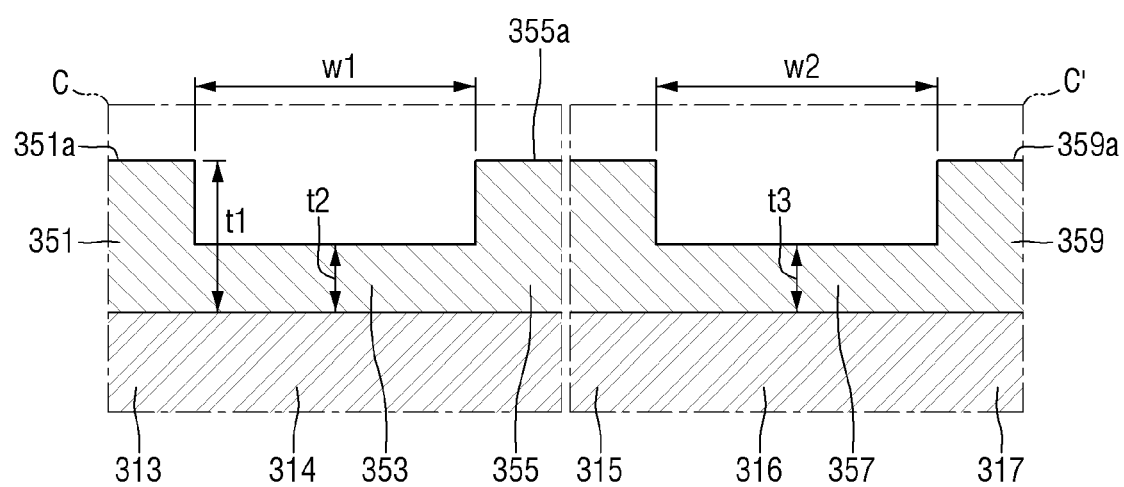
FIG. 20 is a cross-sectional view according to an alternative embodiment based on the embodiment of FIG. 7.

FIG. 20 is a cross-sectional view according to an alternative embodiment based on the embodiment of FIG. 7.

The embodiment of the display device of FIG. 20 is substantially the same as the embodiment of FIG. 8 except that the burrs 361 of FIG. 8 are not disposed.

In such an embodiment, recessed portions of the support member may be formed using a cutting device, such as a knife, so that the burrs 361 are not formed, or the burrs 361 formed may be removed through a washing liquid, laser, or the like.

Figure 21:
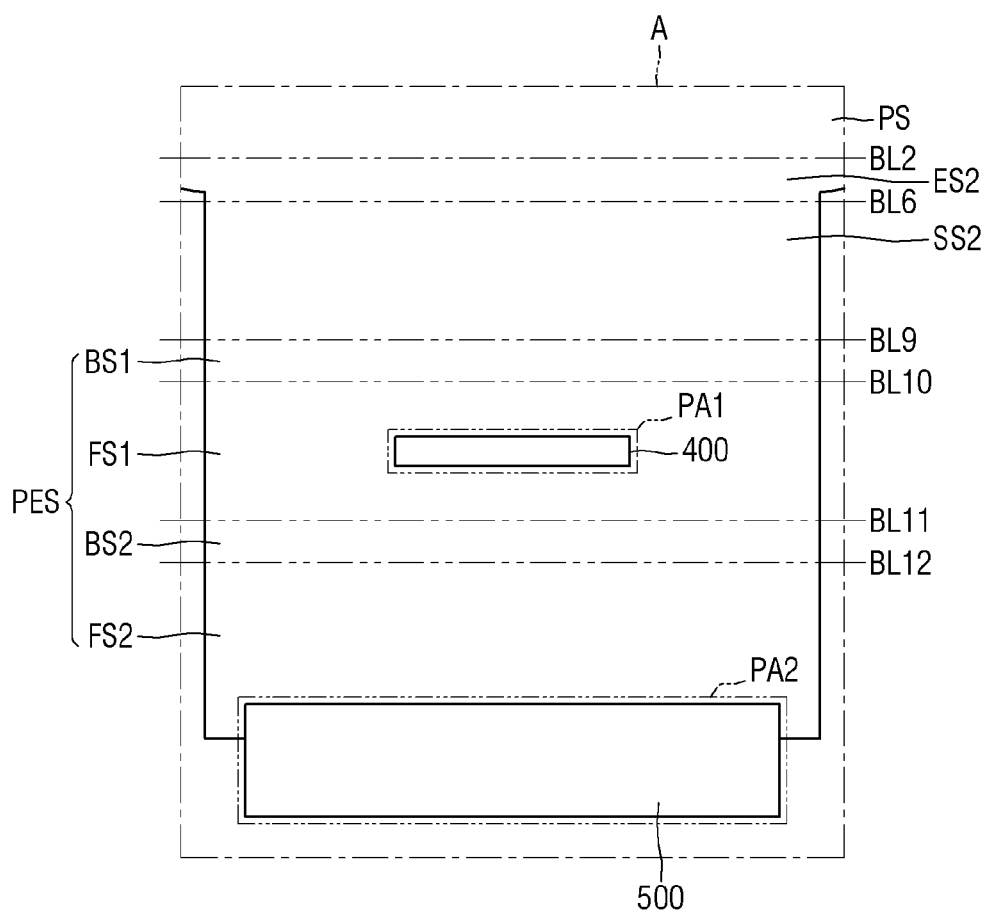
FIG. 21 is a plan layout view of a display device according to an alternative embodiment.
Figure 22:
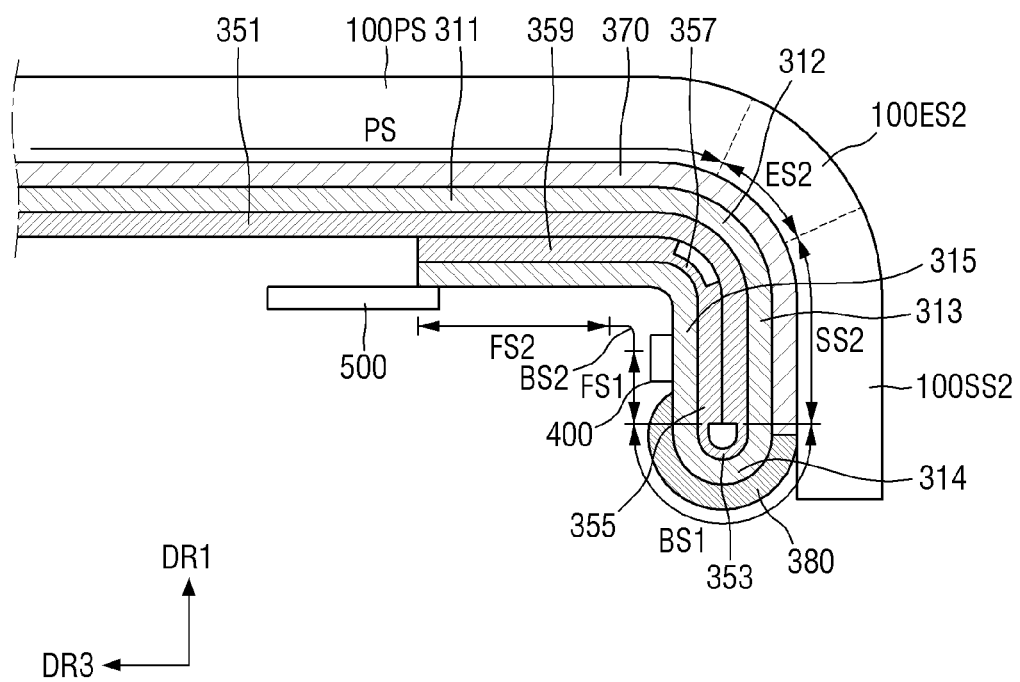
FIG. 22 is a cross-sectional view of FIG. 21.

FIG. 21 is a plan layout view of a display device according to an alternative embodiment. FIG. 22 is a cross-sectional view of FIG. 21.

The embodiment of display device of FIGS. 21 and 22 is substantially the same as the embodiment of FIG. 3 except that a data driving integrated circuit 400 is disposed on a first flat portion FS1.

That is, the data driving integrated circuit 400 may be disposed on the first flat portion FS1 in an overlapping manner.

According to an embodiment, a bending protective layer 380 may be disposed only on a fourth substrate portion 314 and a fifth substrate portion 315, and may not be disposed on a sixth substrate portion 316 and a seventh substrate portion 317. Accordingly, the cost for materials used to form the bending protective layer 380 may be reduced. However, the disclosure is not limited thereto, and alternatively, as in FIG. 7, the bending protective layer 380 may also be disposed on the sixth substrate portion 316 and the seventh substrate portion 317. In such an embodiment, the bending protective layer 380 may cover up to the surface of the data driving integrated circuit 400.

Figure 23:
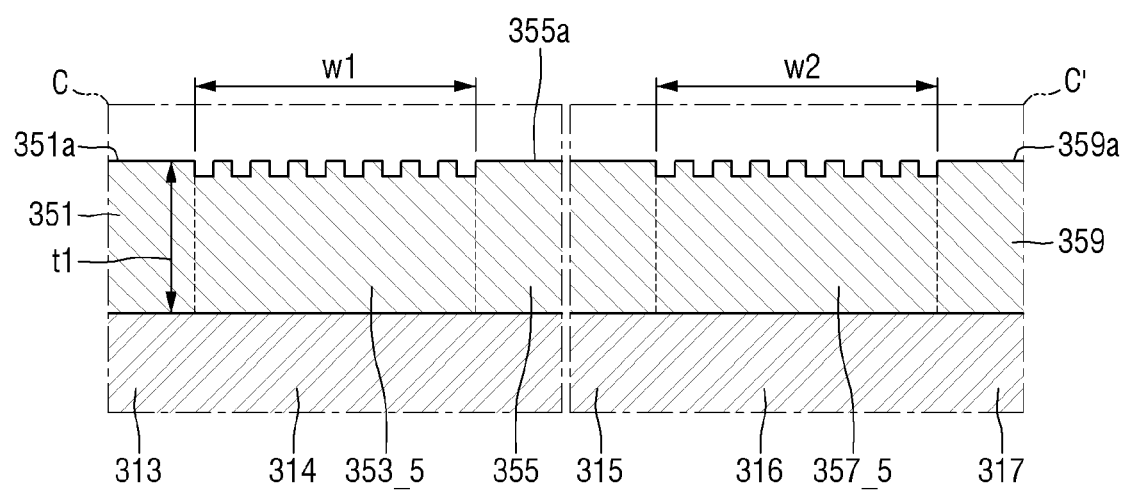
FIG. 23 is a cross-sectional view according to an alternative embodiment based on the embodiment of FIG. 7.

FIG. 23 is a cross-sectional view according to an alternative embodiment based on the embodiment of FIG. 7.

The embodiment of the display device of FIG. 23 is substantially the same as the embodiment of FIG. 8 except that second surfaces or surfaces of a second portion 353_5 and a fourth portion 357_5 include uneven surfaces.

Convex portions of the second portion 353_6 and the fourth portion 357_5 may have a first thickness t1, and concave portions thereof may have a thickness that is less than the first thickness t1.

Figure 24:
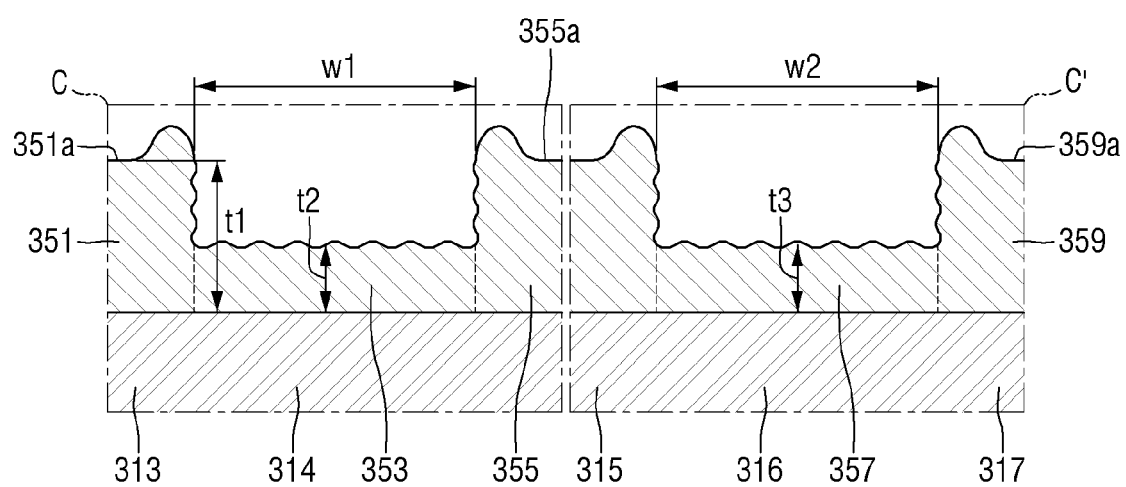
FIG. 24 is a cross-sectional view according to an alternative embodiment based on the embodiment of FIG. 7.

FIG. 24 is a cross-sectional view according to an alternative embodiment based on the embodiment of FIG. 7.

The embodiment of the display device of FIG. 24 is substantially the same as is substantially the same as the embodiment of FIG. 8 except that side surfaces of a first portion 351, a third portion 355, and a fifth portion 359 adjacent to a second portion 353_6 and a fourth portion 357_6 and surfaces or second surfaces of the second portion 353_6 and the fourth portion 357_6 include uneven surfaces.

Figure 25:
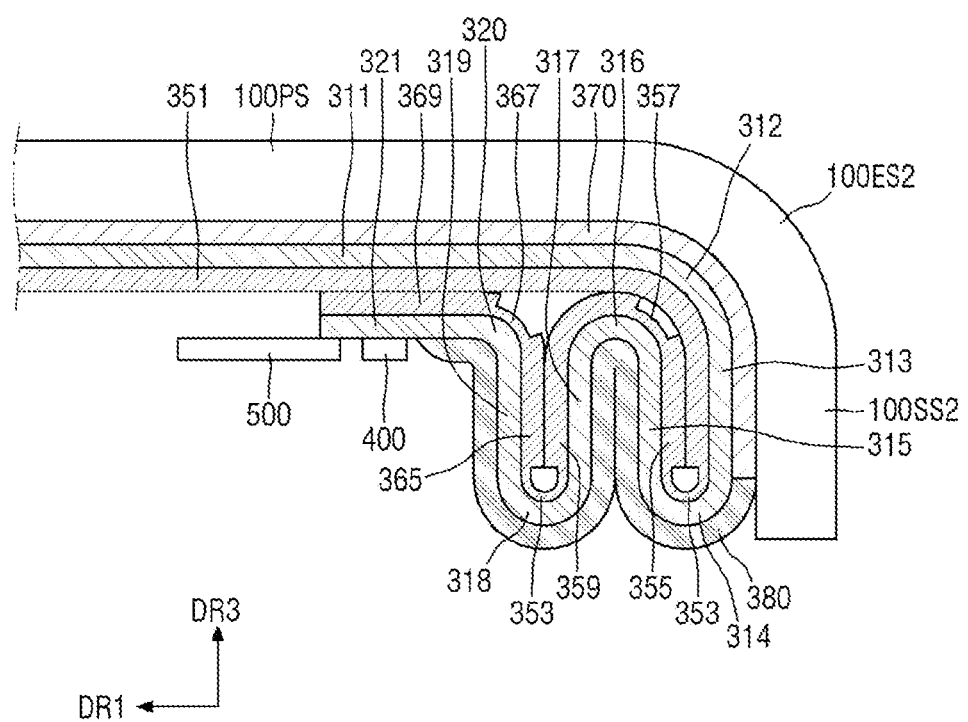
FIG. 25 is a cross-sectional view of a display device according to an alternative embodiment.

FIG. 25 is a cross-sectional view of a display device according to an alternative embodiment.

The embodiment of the display device of FIG. 25 is substantially the same as the display device of FIG. 7 except that a multi-bent portion further includes two more bent portions.

In such an embodiment, a flexible substrate may further include an eighth substrate portion 318 connected to a seventh substrate portion 317, a ninth substrate portion 319 connected to the eighth substrate portion 318, a tenth substrate portion 320 connected to the ninth substrate portion 319, and an eleventh substrate portion 321 connected to the tenth substrate portion 320. In such an embodiment, the support member may further include a sixth portion 363 connected to a fifth portion 359, a seventh portion 365 connected to the sixth portion 363, an eighth portion 367 connected to the seventh portion 365, and a ninth portion 369 connected to the eighth portion 367.

The sixth portion 363 and the eighth portion 367 may have thicknesses that are less than those of the adjacent portions.

The sixth substrate portion 316 may be bent in a vertically inverted form of the fourth substrate portion 314, the eighth substrate portion 318 may be bent in the same way as the fourth substrate portion 314, and the tenth substrate portion 320 may be bent in the same way as the sixth substrate portion 316 of FIG. 7.

Figure 26:
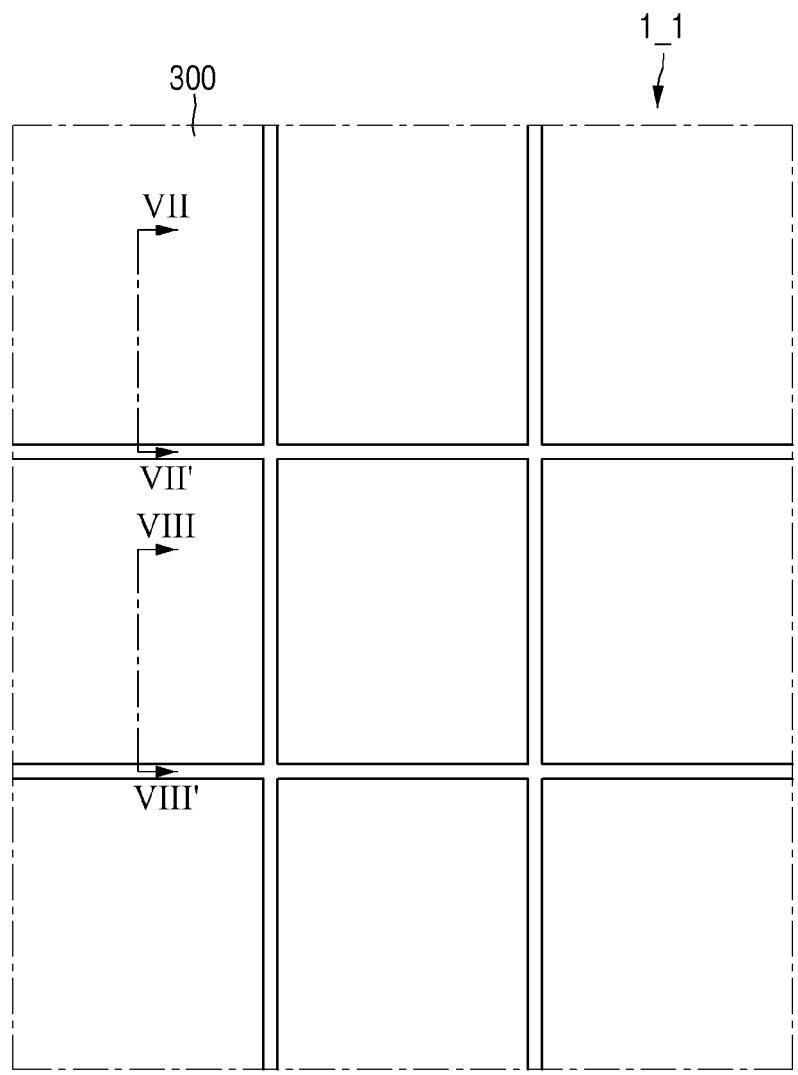
FIG. 26 is a plan view of a display device according to an alternative embodiment.
Figure 27:
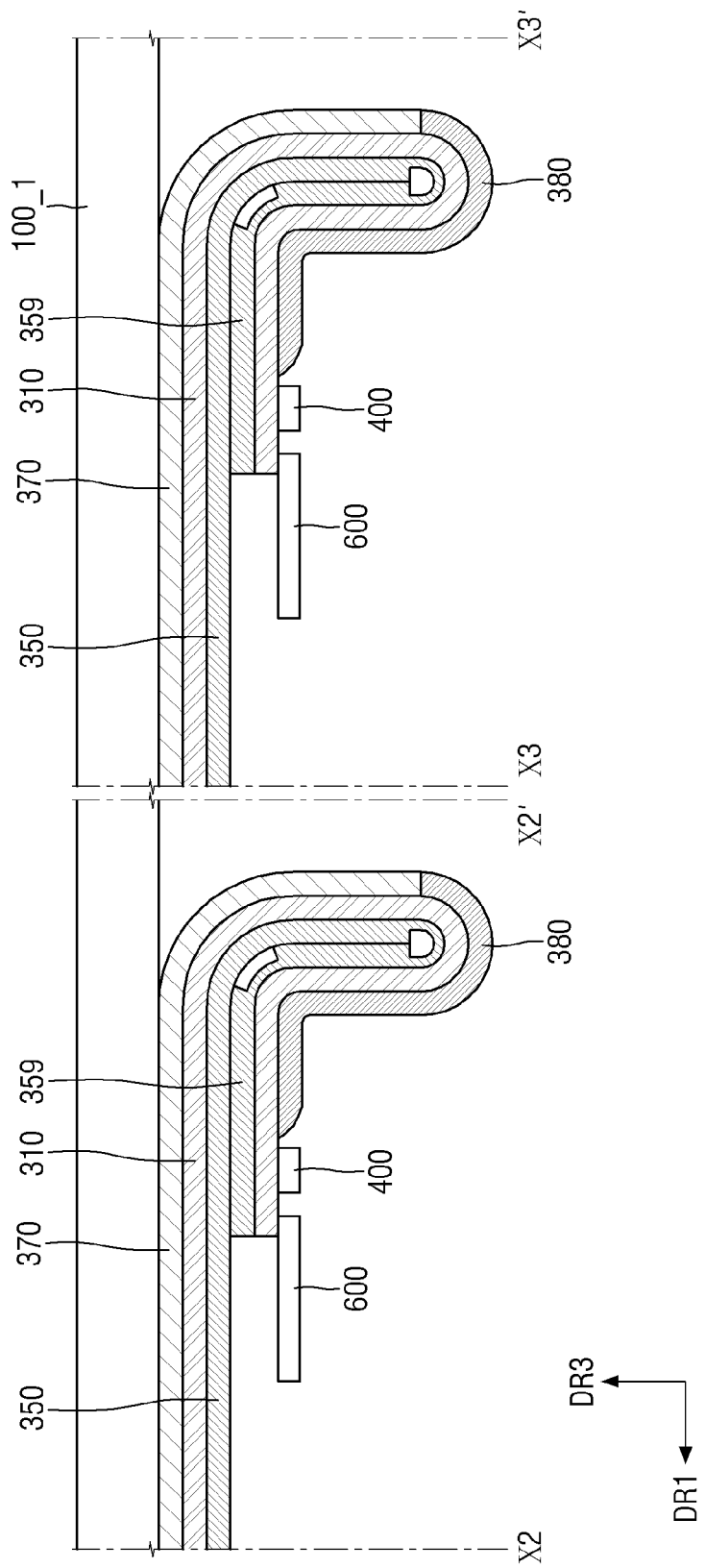
FIG. 27 illustrates cross-sectional views taken along lines X2-X2' and X3-X3' of FIG. 26.

FIG. 26 is a plan view of a display device according to another embodiment, and FIG. 27 illustrates cross-sectional views taken along lines X2-X2' and X3-X3' of FIG. 26.

The embodiment of the display device 1_1 shown in FIGS. 26 and 27 is substantially the same as the display device 1 except that the display device 1_1 is configured as a tiled display device.

In such an embodiment, the display panel 300 described above with reference to FIG. 1 is provided in plural and arranged along a matrix direction, and one window member 100_1 may be disposed on the display panels 300.

In such an embodiment, other features or components are substantially the same as those described above, and thus any repetitive detailed descriptions thereof will be omitted.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

The invention claimed is:

1. A display device comprising:
a flexible substrate having a first surface and a second surface which is opposite to the first surface, wherein the flexible substrate includes an upper surface portion extending along a first direction, a first bent portion connected to the upper surface portion, a first side portion connected to the first bent portion, a second bent portion connected to the first side portion, a second side portion connected to the second bent portion, a third bent portion connected to the second side portion, and a lower surface portion connected to the third bent portion; and
a support member disposed on the second surface of the flexible substrate,
wherein:
the first bent portion is bent in a way such that the first side portion is bent from the upper surface portion toward a thickness direction,
the second bent portion is bent in a way such that the second surface of the first side portion and the second surface of the second side portion face each other,
the third bent portion is bent in a way such that the lower surface portion is bent from the second side portion toward the first direction and the second surface of the lower surface portion and the second surface of the upper surface portion face each other, and
a portion of the support member disposed to overlap the second bent portion has a thickness less than a thickness of a portion disposed on the first side portion and a thickness of a portion disposed on the second side portion.

2. The display device of claim 1, wherein the support member includes a first portion disposed on the second surface of the upper surface portion, the second surface of the first bent portion, and the second surface of the first side portion, a second portion disposed on the second surface of the second bent portion, a third portion disposed on the second surface of the second side portion, a fourth portion disposed on the second surface of the third bent portion, and a fifth portion disposed on the second surface of the lower surface portion, and
a thickness of the second portion is less than thicknesses of the first portion and the third portion.

3. The display device of claim 2, wherein
the support member has a first surface facing the flexible substrate and a second surface opposite to the first surface,
the second portion is bent in a way such that the second surface of the third portion and the second surface of the first portion face each other, and the fourth portion is bent in a way such that the second surface of the fifth portion and the second surface of the first portion face each other.

4. The display device of claim 3, wherein
the second surface of the first portion and the second surface of the fifth portion are in contact with each other, and
the second surface of the first portion and the second surface of the third portion are in contact with each other.

5. The display device of claim 4, wherein the second surface of the first portion is not in contact with the second surface of the fourth portion.

6. The display device of claim 5, wherein the thickness of the fourth portion is less than the thicknesses of the first portion and the third portion.

7. The display device of claim 6, wherein the thickness of the fourth portion is less than thicknesses of the third portion and the fifth portion.

8. The display device of claim 7, wherein the support member is not disposed on the second bent portion and the support member is not disposed on the third bent portion.

9. The display device of claim 7, wherein
the second portion includes an uneven surface,
a surface height of a convex portion of the second portion is equal to a surface height of the first portion, and
a surface height of a concave portion of the second portion is less than the surface height of the first portion.

10. The display device of claim 2, wherein
the first portion further includes a burr shaped portion disposed adjacent to the second portion, and
the burr shaped portion protrudes from the second surface of the first portion.

11. The display device of claim 10, wherein the third portion further includes a burr shaped portion disposed adjacent to the second portion and the fourth portion.

12. The display device of claim 1, further comprising:
a driving chip disposed on the first surface of the lower surface portion,
wherein the driving chip is disposed to overlap the upper surface portion in the thickness direction.

13. The display device of claim 12, further comprising:
a circuit board disposed on the first surface of an end of the lower surface portion.

14. The display device of claim 13, further comprising:
an optical member disposed on the first surface of the flexible substrate,
wherein the optical member is disposed on the upper surface portion, the first bent portion, and the first side portion of the flexible substrate.

15. The display device of claim 14, further comprising:
a window member disposed on the optical member.

16. The display device of claim 1, further comprising:
a driving chip disposed on the first surface of the second side portion,
wherein the driving chip is disposed to overlap the first side portion in a side direction.

17. A method for manufacturing a display device, the method comprising:
preparing a flexible substrate having a first surface and a second surface opposite to the first surface, and a support member disposed over the second surface of the flexible substrate, wherein the flexible substrate includes an upper surface portion extending along a first direction, a first bent portion connected to the upper surface portion, a first side portion connected to the first bent portion, a second bent portion connected to the first side portion, a second side portion connected to the second bent portion, a third bent portion connected to the second side portion, and a lower surface portion connected to the third bent portion, and wherein the support member includes a first portion disposed on the second surface of the upper surface portion, the second surface of the first bent portion, and the second surface of the first side portion, a second portion disposed on the second surface of the second bent portion, a third portion disposed on the second surface of the second side portion, a fourth portion disposed on the second surface of the third bent portion, and a fifth portion disposed on the second surface of the lower surface portion;

mounting a driving chip on the first surface of the flexible substrate;

bending the first bent portion by disposing a curved window on the first surface of the flexible substrate so thatin a way such that the first side portion of the flexible substrate is bent from the upper surface portion toward a thickness direction; and making a thickness of the second portion smaller than a thickness of adjacent portions thereof.

18. The method of claim 17, further comprising:
making a thickness of the fourth portion smaller than a thickness of adjacent portions thereof before or after the making the thickness of the second portion smaller than the thickness of the adjacent portions thereof.

19. The method of claim 18, wherein the making the thickness of the fourth portion smaller than the thickness of the adjacent portions thereof before or after the making the thickness of the second portion smaller than the thickness of the adjacent portions thereof includes bringing a tip of a heat block into contact with each of the second portion and the fourth portion.

20. The method of claim 18, wherein the driving chip is disposed on the second side portion of the flexible substrate.

21. The method of claim 18, wherein the bending the first bent portion includes bending the first bent portion along a curved surface of the curved window by disposing the curved window on the first surface of the flexible substrate.

* * * * *